United States Patent
Kameda et al.

(10) Patent No.: US 11,414,755 B2
(45) Date of Patent: Aug. 16, 2022

(54) ATOMIC LAYER DEPOSITION METHOD AND ATOMIC LAYER DEPOSITION DEVICE

(71) Applicant: MEIDENSHA CORPORATION, Tokyo (JP)

(72) Inventors: Naoto Kameda, Moriya (JP); Toshinori Miura, Chiba (JP); Mitsuru Kekura, Numazu (JP)

(73) Assignee: MEIDENSHA CORPORATION, Tokyo (JP)

(*) Notice: Subject to any disclaimer, the term of this patent is extended or adjusted under 35 U.S.C. 154(b) by 0 days.

(21) Appl. No.: 17/431,823

(22) PCT Filed: Aug. 30, 2019

(86) PCT No.: PCT/JP2019/034118
§ 371 (c)(1),
(2) Date: Aug. 18, 2021

(87) PCT Pub. No.: WO2020/170482
PCT Pub. Date: Aug. 27, 2020

(65) Prior Publication Data
US 2022/0090262 A1    Mar. 24, 2022

(30) Foreign Application Priority Data
Feb. 19, 2019    (JP) .................. JP2019-027024

(51) Int. Cl.
*C23C 16/40*    (2006.01)
*C23C 16/455*    (2006.01)

(52) U.S. Cl.
CPC ........ *C23C 16/45544* (2013.01); *C23C 16/40* (2013.01); *C23C 16/45559* (2013.01); *C23C 16/45565* (2013.01)

(58) Field of Classification Search
CPC .............. C23C 16/40; C23C 16/45544; C23C 16/45559; C23C 16/45565
See application file for complete search history.

(56) References Cited

U.S. PATENT DOCUMENTS 5,960,319 A    9/1999    Iwata et al.
2008/0056975 A1*    3/2008    Won ................... C01G 27/02
                                                204/194

(Continued)

FOREIGN PATENT DOCUMENTS

JP    53-145117 A    12/1978
JP    03-016120 A    1/1991

(Continued)

OTHER PUBLICATIONS

Hirose, F., et al., "Atomic layer deposition of SiO2 from Tris(dimethylamino)silane and ozone by using temperature-controlled water vapor treatment". Thin Solid Films 519 (2010) 270-275.*

(Continued)

*Primary Examiner* — Bret P Chen
(74) *Attorney, Agent, or Firm* — Foley & Lardner LLP

(57) ABSTRACT

An atomic layer deposition apparatus (1) is equipped with a processing substrate (2) provided in a vacuum container (3), and a shower head (4). The processing substrate (2) is provided in the vacuum container (3), and the shower head (4) is provided to be opposed to a processing surface of the processing substrate (2). A high-concentration ozone gas, an unsaturated hydrocarbon gas, and an ALD source gas are supplied from the shower head (4) to the processing substrate (2). The apparatus (1) repeats four steps of an oxidizing agent supplying step of supplying the high-concentration ozone gas and the unsaturated hydrocarbon gas into the vacuum container (3), an oxidizing agent purging step of discharging the gas supplied in the oxidizing agent supply- (Continued)

ing step, a source gas supplying step of supplying a source gas to the vacuum container (3), and a source gas purging step of discharging the source gas supplied to the vacuum container (3), to form an oxide film on the surface of the processing substrate (2). In the oxidizing agent purging step and/or the source gas purging step, the unsaturated hydrocarbon or ozone is used as the purging gas.

13 Claims, 15 Drawing Sheets

(56) References Cited

U.S. PATENT DOCUMENTS

| | | | |
|---|---|---|---|
| 2008/0240978 A1* | 10/2008 | Sorensen | A61L 2/208 |
| | | | 422/27 |
| 2012/0309163 A1* | 12/2012 | Kiyomura | H01L 27/10852 |
| | | | 427/79 |
| 2013/0207171 A1* | 8/2013 | Uno | H01L 27/0629 |
| | | | 257/310 |
| 2014/0134812 A1* | 5/2014 | Kim | H01L 21/28194 |
| | | | 438/270 |
| 2014/0242809 A1 | 8/2014 | Hashimoto et al. | |
| 2014/0287598 A1 | 9/2014 | Hirose et al. | |
| 2016/0047047 A1 | 2/2016 | Moroi | |
| 2017/0114165 A1 | 4/2017 | Ishihama et al. | |
| 2018/0237330 A1* | 8/2018 | Shinada | C03B 37/018 |
| 2019/0237330 A1* | 8/2019 | Abatchev | H01J 37/32422 |
| 2020/0361966 A1* | 11/2020 | Kim | C01B 33/027 |
| 2021/0222294 A1* | 7/2021 | Kim | C23C 16/045 |

FOREIGN PATENT DOCUMENTS

| | | | | |
|---|---|---|---|---|
| JP | 04-262530 A | | 9/1992 | |
| JP | 08-339970 A | | 12/1996 | |
| JP | 2008-294170 A | | 12/2008 | |
| JP | 2013-207005 | * | 10/2013 | ........... H01L 21/316 |
| JP | 2013-207005 A | | 10/2013 | |
| JP | 2014-057014 A | | 3/2014 | |
| JP | 2014-165395 A | | 9/2014 | |
| JP | 2014-183219 A | | 9/2014 | |
| JP | 2016-040402 A | | 3/2016 | |
| JP | 6677356 B1 | * | 4/2020 | ........... H01L 21/316 |
| WO | WO 2015/152268 A1 | | 10/2015 | |

OTHER PUBLICATIONS

Park, Hyunwoo, et al., "Effect of ozone concentration on atomic layer deposited tin oxide". J. Vac. Sci. Technol. A 36(5), Sep./Oct. 2018, May 15, 2009 pp. 1-7.*

Cho, Deok-Yong, et al., "Stabilization of Tetragonal HfO2 under Low Active Oxygen Source Environment in Atomic Layer Deposition". Chemistry of Materials 2012, 24, 3534-3543.*

Yongfu, Xu, et al., "A kinetic study of the reaction of ozone with ethylene in a smog chamber under atmospheric conditions". Chinese Science Bulletin 2006 vol. 51, No. 23, pp. 2839-2843.*

Russo, Aric C., et al., "Low-Temperature Oxidation of Ethylene by Ozone in a Jet-Stirred Reactor". J. Phys. Chem. A 2018, 122, 8674-8685.*

Miura et al., Production and Detection of OH Species by a Highly Concentrated Ozone Gas for Thin Film Processing, Abstract Book of 12$^{th}$ ACSIN-21 in conjunction with ICSPM 21, Tsukuba, The Japan Society of Applied Physics, Nov. 4, 2013, p. 98.

Convertech, Processing Technology Study Group, Sep. 15, 2018, 3 pages.

News Release in 2018, "A Technology to Make Oxide Films at Normal Temperatures By Using Pure Ozone Was Established for the First Time in the World." [online], Jul. 31, 2019, Homepage of Meidensha Corporation, 3 pages, Internet, <https://www.meidensha.co.jp/news/news_03/news_03_01/1227605_2469.html>.

* cited by examiner

ATOMIC LAYER DEPOSITION METHOD AND ATOMIC LAYER DEPOSITION DEVICE

The present invention relates to an atomic layer deposition method and an atomic layer deposition apparatus.

BACKGROUND ART

As a means of thin-film formation method of leading-edge devices such as semiconductor devices (e.g., CPU circuits), vapor deposition, sputtering, CVD (Chemical Vapor Deposition), ALD (Atomic Layer Deposition) are representative ones. Of these, ALD is the best in step covering property and compactness, and is essential as a thin-film formation means of leading-edge devices (e.g., Patent Publication 1).

In ALD, mainly, there are repeatedly conducted four steps, a step of evacuating a vacuum container in its entirety that is equipped with a processing substrate (e.g., silicon wafer), a step of introducing an ALD source gas (e.g., TMA (trimethyl aluminium)) into the vacuum container, a step of removing the source gas from the vacuum container, and a step of supplying an oxidizing agent (e.g., water vapor) of the source gas. By introducing the source gas into the vacuum container to fill the vacuum container with the source gas, the source gas in an amount of one molecular layer is attached to the surface of the processing substrate, thereby forming a molecular layer of the source gas on the surface of the processing substrate. Then, an oxidizing agent of the source gas is supplied into the vacuum container. Thereby, the molecular layer of the source gas that has been formed on the surface of the processing substrate is oxidized to form a molecular layer of an oxide layer (e.g., aluminum oxide) of the source gas on the surface of the processing substrate. By repeating the above-mentioned four steps, there is formed a thin film having a film thickness corresponding to the number of repetitions.

The film formation step by ALD has a tendency that the processing temperature becomes high. For example, in order to make TMA and water vapor sufficiently react with each other, it is necessary to heat the processing substrate until 300° C. to 500° C. Furthermore, in compound semiconductors such as GaN and ZnO used in leading-edge devices, thin-film semiconductor layers that are slightly different in composition by heteroepitaxy or MBE (Molecular Beam Epitaxy) are formed on the surface by stacking several layers. These thin-film semiconductor layers become different in composition by heating. Therefore, a low-temperature processing is strongly demanded. Furthermore, in other leading-edge devices, it is considered that the temperature of the film formation step by ALD is preferably from room temperature to 100° C. Therefore, an ALD in which ozone ($O_3$) or plasma oxygen is used as the oxidizing agent is under consideration. Since ozone is capable of generating oxygen radicals as a strong oxidizing agent through pyrolysis, a low temperature processing was possible. Nevertheless, it was necessary to heat the substrate at several hundred degrees Celsius. Furthermore, even in the case of using plasma oxygen that is capable of supplying oxygen radicals from the beginning and making the lowest temperature processing possible, the low temperature is around 100° C. to 150° C. Thus, a lower temperature processing is demanded.

Furthermore, the film formation step by ALD takes a long processing time. To form one molecular layer by ALD, it is necessary to conduct a step in which the source gas is adsorbed on the surface of the processing substrate, then the source gas is removed, and then the source gas layer formed on the surface of the processing substrate is oxidized. Normally, this step requires several minutes. For example, in the case of aluminum oxide, the thickness of one molecular layer is about 0.1 nm. Since about one-hundred molecules layer is necessary for a practical film formation of 10 nm, even 100 minutes are necessary supposing 1 minute per one molecular layer. For example, in other film formation methods such as CVD, the film formation of 10 nm is possible by one minute or less. Therefore, as compared with other processing methods, a long processing time of ALD is a serious demerit, and shortening of the processing time is demanded.

PRIOR ART PUBLICATIONS

Patent Publications

Patent Publication 1: JP Patent Application Publication 2014-057014.
Patent Publication 2: JP Patent Application Publication 2008-294170.

Non-Patent Publications

Non-patent Publication 1: Abstract Book of $12^{th}$ ACSIN-21 in conjunction with ICSPM 21, Tsukuba (2013), The Japan Society of Applied Physics, Nov. 4, 2013, p. 98.
Non-patent Publication 2: CONVERTECH, Processing Technology Study Group, Sep. 15, 2018, September issue in 2018.
Non-patent Publication 3: News Release in 2018, "A technology to make oxide films at normal temperatures by using pure ozone was established for the first time in the world." [online], Jul. 31, 2019, Homepage of MEIDENSHA CORPORATION, Internet, <https://www.meidensha.co.jp/news/news_03/news_03_01/1227605_2469.ht ml>

SUMMARY OF THE INVENTION

The present invention was made in view of the above-mentioned situation, and it is an object thereof to provide a technology to contribute to lowering of the processing temperature and shortening of the processing time in the film formation step by ALD.

According to one aspect of an atomic layer deposition method of the present invention to achieve the above object, there is provided an atomic layer deposition method for forming an oxide film on a processing substrate, comprising a source gas supplying step of supplying to the processing substrate a source gas that contains an element constituting the oxide film, thereby forming an adsorbed layer of the source gas on a surface of the processing substrate; a source gas purging step of purging an excess gas of the source gas supplied in the source gas supplying step and a gas generated by an adsorption of the source gas onto the processing substrate, after the source gas supplying step; an oxidizing agent supplying step of supplying an ozone gas of 20 volume % or greater and an unsaturated hydrocarbon gas to the processing substrate formed thereon with the adsorbed layer of the source gas, after the source gas purging step, thereby oxidizing the adsorbed layer adsorbed onto the processing substrate; and an oxidizing agent purging step of purging an excess gas of the ozone gas and the unsaturated hydrocarbon gas, which are supplied in the oxidizing agent supplying step, and a gas generated by oxidizing the adsorbed layer of the source gas, after the oxidizing agent supplying step. In the atomic layer deposition method, one or both steps of the source gas purging step and the oxidizing agent purging step are conducted by introducing the unsaturated hydrocarbon gas into a vacuum container equipped with the processing substrate, and at least one cycle of the source gas supplying step, the source gas purging step, the oxidizing agent supplying step, and the oxidizing agent purging step is repeated.

Furthermore, according to another aspect of the atomic layer deposition method, there is provided an atomic layer deposition method for forming an oxide film on a processing substrate, comprising a source gas supplying step of supplying to the processing substrate a source gas that contains an element constituting the oxide film, thereby forming an adsorbed layer of the source gas on a surface of the processing substrate; a source gas purging step of purging an excess gas of the source gas supplied in the source gas supplying step and a gas generated by an adsorption of the source gas onto the processing substrate, after the source gas supplying step; an oxidizing agent supplying step of supplying an ozone gas of 20 volume % or greater and an unsaturated hydrocarbon gas to the processing substrate formed thereon with the adsorbed layer of the source gas, after the source gas purging step, thereby oxidizing the adsorbed layer adsorbed onto the processing substrate; and an oxidizing agent purging step of purging an excess gas of the ozone gas and the unsaturated hydrocarbon gas, which are supplied in the oxidizing agent supplying step, and a gas generated by oxidizing the adsorbed layer of the source gas, after the oxidizing agent supplying step. In the atomic layer deposition method, one or both steps of the source gas purging step and the oxidizing agent purging step are conducted by introducing the ozone gas into a vacuum container equipped with the processing substrate, and at least one cycle of the source gas supplying step, the source gas purging step, the oxidizing agent supplying step, and the oxidizing agent purging step is repeated.

Furthermore, according to another aspect of the atomic layer deposition method, there is provided an atomic layer deposition method for forming an oxide film on a processing substrate, comprising a source gas supplying step of supplying to the processing substrate a source gas that contains an element constituting the oxide film, thereby forming an adsorbed layer of the source gas on a surface of the processing substrate; a source gas purging step of purging an excess gas of the source gas supplied in the source gas supplying step and a gas generated by an adsorption of the source gas onto the processing substrate, after the source gas supplying step; an oxidizing agent supplying step of supplying an ozone gas of 20 volume % or greater and an unsaturated hydrocarbon gas to the processing substrate formed thereon with the adsorbed layer of the source gas, after the source gas purging step, thereby oxidizing the adsorbed layer adsorbed onto the processing substrate; and an oxidizing agent purging step of purging an excess gas of the ozone gas and the unsaturated hydrocarbon gas, which are supplied in the oxidizing agent supplying step, and a gas generated by oxidizing the adsorbed layer of the source gas, after the oxidizing agent supplying step. In the atomic layer deposition method, one or both steps of the source gas purging step and the oxidizing agent purging step are conducted by introducing an inert gas into a vacuum container equipped with the processing substrate, and at least one cycle of the source gas supplying step, the source gas purging step, the oxidizing agent supplying step, and the oxidizing agent purging step is repeated.

In an aspect of the atomic layer deposition method, it is optional that the source gas, the ozone gas or the unsaturated hydrocarbon gas is supplied separately or in combination from a shower head provided to be opposed to the processing substrate.

Furthermore, it is optional that one or both of supplying the source gas and supplying the unsaturated hydrocarbon gas are conducted together with supplying a carrier gas.

Furthermore, it is optional that, in supplying the carrier gas, there are conducted a first step of supplying the carrier gas at a predetermined flow rate, and a second step of resuming supplying the carrier gas at a flow rate that is higher than that of the first step, after supplying the carrier gas by the first step is stopped.

Furthermore, it is optional that the unsaturated hydrocarbon gas is ethylene gas.

Furthermore, it is optional that the processing substrate is heated at 100° C. or lower or not heated.

Furthermore, it is optional that the oxide film comprises an oxide film layer of any of $Al_2O_3$, $HfO_2$, $TiO_2$, ZnO, $Ta_2O_3$, $Ga_2O_3$, $MoO_3$, $RuO_2$, $SiO_2$, $ZrO_2$, and $Y_2O_3$.

Furthermore, it is optional that four steps of the source gas supplying step, the source gas purging step, the oxidizing agent supplying step, and the oxidizing agent purging step are conducted by a plurality of cycles, and, in the source gas supplying step of the steps conducted by the plurality of cycles, a different type of the source gas is supplied to the processing substrate.

Furthermore, it is optional that, before or after conducting four steps of the source gas supplying step, the source gas purging step, the oxidizing agent supplying step and the oxidizing agent purging step, an oxide film is formed on the processing substrate by simultaneously supplying the source gas, the ozone gas, and the unsaturated hydrocarbon gas.

Furthermore, it is optional that, in one or both of the source gas purging step and the oxidizing agent purging step, a purging gas supplied to the vacuum container has an atmospheric dew point of −50° C. or lower.

Furthermore, it is optional that pressure of the vacuum container is 1000 Pa or lower.

According to one aspect of an atomic layer deposition apparatus, there is provided an atomic layer deposition apparatus for forming an oxide film on a processing substrate by an atomic layer deposition method, comprising a vacuum container equipped with the processing substrate; and a shower head provided to be opposed to a processing surface of the processing substrate, wherein the shower head has at least a first hole for blowing off an ozone gas of 20 volume % or greater, and a second hole for blowing off an unsaturated hydrocarbon gas, wherein a distance between the first and second holes adjacent to each other is from 0.7 mm to 71 mm, wherein a source gas that contains an element constituting the oxide film is supplied into the vacuum container, thereby forming an adsorbed layer of the source gas on a surface of the processing substrate, wherein at least the ozone gas of 20 volume % or greater and the unsaturated hydrocarbon gas are supplied from the shower head to the processing surface of the processing substrate, thereby oxidizing the adsorbed layer.

In an aspect of the atomic layer deposition apparatus, it is optional that the first holes are equidistantly aligned in two directions that are perpendicular to each other along the processing surface, the first holes being arranged in a rectangular lattice shape, and that the second hole is at a position that is displaced from the first hole along the processing surface, the second holes being equidistantly aligned in directions respectively parallel with the two directions and being arranged in a rectangular lattice shape.

As mentioned above, according to the present invention, it is possible to lower the processing temperature and shorten the processing time in the film formation by ALD.

BRIEF DESCRIPTION OF THE DRAWINGS

FIG. 6 are explanatory views of a film formation step of an ALD method according to a first embodiment of the present invention, wherein FIG. 6(a) is a view showing an oxidizing agent supplying step, FIG. 6(b) is a view showing an oxidizing agent purging step, FIG. 6(c) is a view showing a source gas supplying step, and FIG. 6(d) is a view showing a source gas purging step;

FIG. 7 are schematic views explaining reactions on the processing substrate surface, wherein FIG. 7(a) is a view showing a reaction between OH* and the processing substrate surface, FIG. 7(b) is a view showing an adsorption of TMA onto the processing substrate, and FIG. 7(c) is a view showing an oxidation reaction of TMA adsorbed on the processing substrate;

FIG. 8 are explanatory views of a film formation step of an ALD method according to a second embodiment of the present invention, wherein FIG. 8(a) is a view showing an oxidizing agent supplying step, FIG. 8(b) is a view showing an oxidizing agent purging step, FIG. 8(c) is a view showing a source gas supplying step, and FIG. 8(d) is a view showing a source gas purging step;

FIG. 9 are explanatory views of a film formation step of an ALD method according to a third embodiment of the present invention, wherein FIG. 9(a) is a view showing an oxidizing agent supplying step, FIG. 9(b) is a view showing an oxidizing agent purging step, FIG. 9(c) is a view showing a source gas supplying step, and FIG. 9(d) is a view showing a source gas purging step;

MODE FOR IMPLEMENTING THE INVENTION

Figure 1:
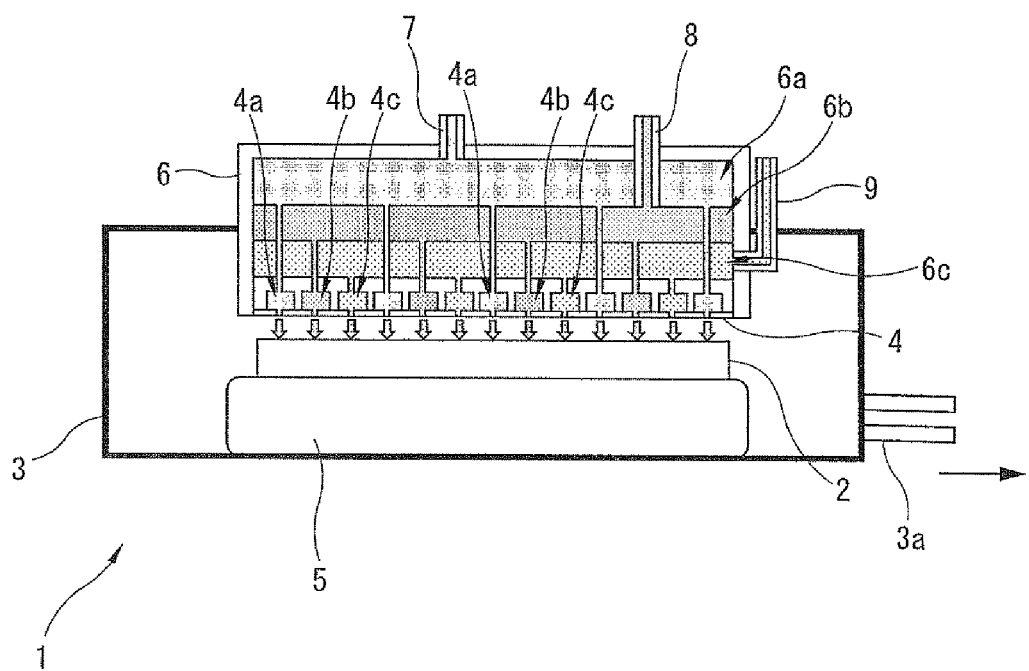
FIG. 1 is a schematic view of an ALD apparatus according to an embodiment of the present invention.

An atomic layer deposition method and an atomic layer deposition apparatus (hereinafter, ALD method and ALD apparatus) according to an embodiment of the present invention are explained in detail with reference to the drawings.

In the ALP method and the ALD apparatus according to an embodiment of the present invention, after an ALD source gas is adsorbed onto a processing substrate, a high-concentration ozone gas of 20 volume % or greater, more preferably 80% or greater, and an unsaturated hydrocarbon gas are supplied, thereby oxidizing the source gas adsorbed onto the processing substrate and forming an oxide film. That is, as an oxidizing agent of the source gas, OH* (OH radical) that is generated by a reaction between ozone and the unsaturated hydrocarbon is used.

An object (hereinafter, a processing substrate) on which a thin film is formed by ALD is, for example, a substrate or film, etc. In particular, in an oxide film formation method using ozone and an unsaturated hydrocarbon, it is possible to form an oxide film at low temperatures. Therefore, it is possible to form an oxide film on not only substrates that are relatively high in heat resistance, such as Si substrate, but also substrates or films formed of synthetic resins that are relatively low in heat resistance. As the synthetic resins to form the substrate or film, there are, for example, polyester resin, aramid resin, olefin resin, polypropylene, PPS (polyphenylene sulfide), PET (polyethylene terephthalate), PEN (polyethylene naphthalate), etc. As others, there are used PE (polyethylene), POM (polyoxymethylene or acetal resin), PEEK (polyether ether ketone), ABS resin (acrylonitrile-butadiene-styrene copolymerized synthetic resin), PA (polyimide), PFA (copolymers of tetrafluoroethylene and perfluoroalkoxy ethylene), PI (polyimide), PVD (polyvinyl dichloride), etc.

It is preferable that the high-concentration ozone gas has an ozone concentration as high as possible. For example, ozone concentration (volume % concentration) of the high-concentration ozone gas is preferably 20-100 volume %, more preferably 80-100 volume %. This is because, if ozone concentration is as close as possible to 100 volume %, the reaction active species (OH) to be generated from ozone can reach the processing substrate surface at a higher density. Besides the reaction necessary for ALD, this reaction active species (OH) can react with carbon (C) as an impurity in the film to remove this carbon (C) in the form of gas. Therefore, it becomes possible to form an oxide film containing a less amount of impurities by supply a greater amount of the reaction active species (OH) to the processing substrate surface. Furthermore, if the ozone concentration is as high as possible (that is, if the oxygen concentration is as low as possible), lifetime of atomic oxygen (O) to be generated by separation of ozone tends to be longer. Due to this too, it is preferable to use a high-concentration ozone gas. That is, a higher ozone concentration lowers oxygen concentration, thereby suppressing deactivation of atomic oxygen (O) caused by its collision with oxygen molecule. Furthermore, it is possible to make the process pressure of the oxide film formation process in reduced pressure by making ozone concentration high. Therefore, from viewpoints of gas flow control and gas flow improvement too, it is preferable to use a high-concentration ozone gas.

The flow rate (supply amount) of a high-concentration ozone gas is preferably two or more times the flow rate (supply amount) of the unsaturated hydrocarbon gas. This is because a decomposition step in which the unsaturated hydrocarbon gas decomposes into OH group is formed of a plurality of steps, in the case of supplying ozone molecules and unsaturated hydrocarbon molecules by a ratio of 1:1, there is a risk that ozone molecules necessary for the reaction become insufficient, thereby not obtaining a sufficient amount of OH groups.

A high-concentration ozone gas can be obtained by separating only ozone through liquefaction from an ozone-containing gas based on a vapor pressure difference and then by vaporizing again the liquefied ozone. An apparatus for obtaining a high-concentration ozone gas is disclosed in, for example, JP Patent Application Publication 2001-304756 and JP Patent Application Publication 2003-20209. These apparatuses for generating high-concentration ozone gases generate a high-concentration ozone (ozone concentration ≈100 volume %) by separating only ozone through liquefaction based on a vapor pressure difference between ozone and other gases (e.g., oxygen). In particular, if there are provided a plurality of chambers to liquefy and vaporize only ozone, it is possible to continuously supply a high-concentration ozone gas by separately subjecting these chambers to temperature control. As a commercial apparatus to generate high-concentration ozone gases, for example, there is provided PURE OZONE GENERATOR (MPOG-HM1A1) made by Meidensha Corporation.

As the source gas, there is used a source gas containing as a constituent element an oxide-film forming element (e.g., lithium (Li), magnesium (Mg), silicon (Si), titanium (Ti), vanadium (V), chromium (Cr), manganese (Mn), iron (Fe), cobalt (Co), nickel (Ni), copper (Cu), zinc (Zn), gallium (Ga), germanium (Ge), yttrium , zirconium (Zr), molybdenum (Mo), ruthenium (Ru), rhodium (Rh), indium (In), tin (Sn), hafnium (Hf), tantalum (Ta), tungsten (W), iridium (Ir), platinum (Pt), lead (Pb), etc., hereinafter these elements are referred to as metals or metal elements). For example, there is used a source gas containing an organic silicon having a Si-O bond or Si-C bond or an organic metal having a metal element and oxygen bond or a metal element and carbon bond, or a source gas of an organic metal complex or a hydride of silicon or metal, etc. Specifically, as the source gas, there is used silane (a general term of hydrogen silicide), TEOS (TetraEthyl OrthoSilicate), TMS (TriMthoxySilane), TES (TriEthoxySilane), TMA (TriMethyl Alminium), TEMAZ (Tetrakis(ethylmethylamino)zirconium), etc. Furthermore, it is also possible to use as the source gas a hetero polynuclear complex (for example, a complex described in JP Patent Application Publication 2016-210742, etc.) containing not only one type of metal element, but also a plural types of metal elements).

As the unsaturated hydrocarbon, there is used a double-bond containing hydrocarbon (alkene) exemplified by ethylene, or a triple-bond containing hydrocarbon (alkyne) exemplified by acetylene. As the unsaturated hydrocarbon, besides ethylene or acetylene, a low molecular weight unsaturated hydrocarbon (for example, an unsaturated hydrocarbon that the number (n) of carbons is 4 or less) such as propylene or butylene is preferably used. When reacting an unsaturated hydrocarbon gas containing such unsaturated hydrocarbon with the source gas or a high-concentration ozone gas, it is preferable that the unsaturated hydrocarbon gas contains a less amount of water. This is because there is a risk of dust generation by a reaction between water and the source gas, if a large amount of water is contained in the gas to be used in the reaction. It is preferable to use an unsaturated hydrocarbon gas having an atmospheric dew point (frost point) of −50° C. or lower (atmospheric pressure: 1013.25 hPa) that is calculated, for example, based on JIS Z 8806. Similarly, as the purging gas to be explained in detail hereinafter, it is also preferable to use a gas having an atmospheric dew point (frost point) of −50° C. or lower.

It is optional to supply the source gas, the ozone gas, and unsaturated hydrocarbon gas, which are relative to the processing substrate (processing substrate 2 in the after-mentioned FIG. 1), separately or in a suitable combination. It is optional to supply the source gas or unsaturated hydrocarbon gas alone or with a carrier gas (supply, for example, at 1 LSM or lower). As the carrier gas, it is possible to mention using an inert gas such as nitrogen gas ($N_2$), argon gas (Ar), helium gas (He), etc.

<<One example of ALD apparatus>>

As shown in FIG. 1, an ALD apparatus 1 according to an embodiment of the present invention is equipped with a vacuum container 3 in which a processing substrate 2 is provided, and a shower head 4 for supplying a high-concentration ozone gas, an unsaturated hydrocarbon gas and a source gas to the processing substrate 2. The processing substrate 2 is provided on a supporting base 5 provided in the vacuum container 3. The vacuum container 3 is equipped with an exhaust pipe 3a. The exhaust pipe 3a is equipped with a vacuum pump, an excluding tube to decompose ozone, etc. The vacuum container 3 is always evacuated to maintain a constant reduced pressure. Furthermore, the gas provided against the processing substrate 2 is evacuated to the outside through the exhaust pipe 3a.

The shower head 4 is provided in a lid 6 that covers an opening section of the vacuum container 3. The lid 6 is equipped with a pipe 7 that supplies a high-concentration ozone gas, a pipe 8 that supplies an unsaturated hydrocarbon gas, and a pipe 9 that supplies the source gas. Each of the pipes 7-9 (and the after-mentioned pipes 11, 13, etc.) is provided with a switching valve (not shown in the drawings). By independently switching each valve, the supply timing of each gas is controlled. The shower head 4 is equipped with holes 4a-4c from which the high-concentration ozone gas, the unsaturated hydrocarbon gas and the source gas supplied from the pipes 7-9 are respectively ejected. The shower head 4 is provided such that its gas supplying surface is opposed to the processing surface of the processing substrate 2. By adjusting the distance between the gas supplying surface of the shower head 4 and the processing surface of the processing substrate 2 to, for example, 1 mm to 100 mm, more preferably 5 mm to 30 mm, it is possible to make short-lifetime active species (active species to be formed by the reaction between ozone and the unsaturated hydrocarbon) react efficiently against the processing substrate 2.

The lid 6 is formed with gas buffer spaces 6a to 6c for gases supplied from the pipes 7-9. By passing through the gas buffer spaces 6a to 6c, pressure and flow rate of the gasses ejected from the holes 4a to 4c of the shower head 4 are equalized.

The shower head 4 does not necessarily need to be equipped with the holes 4a to 4c from which the three gases are separately ejected. For example, like a shower head 10 shown in FIG. 2, it may be equipped with holes 10a from which a high-concentration ozone gas is ejected, and holes 10b from which the unsaturated hydrocarbon gas or the source gas is ejected. In this case, the lid 6 is equipped with the pipe 7 to supply the high-concentration ozone gas and a pipe to supply the unsaturated hydrocarbon gas and the source gas. Then, the unsaturated hydrocarbon gas and the source gas are alternately supplied from the holes 10b of the shower head 10 to the processing substrate 2. Furthermore, as shown in FIG. 3, a shower head 12 may be equipped with holes 12a from which a high-concentration ozone gas is ejected, holes 12b from which the unsaturated hydrocarbon gas is ejected, and a pipe 13 to supply the source gas into the vacuum container 3.

Figure 4:
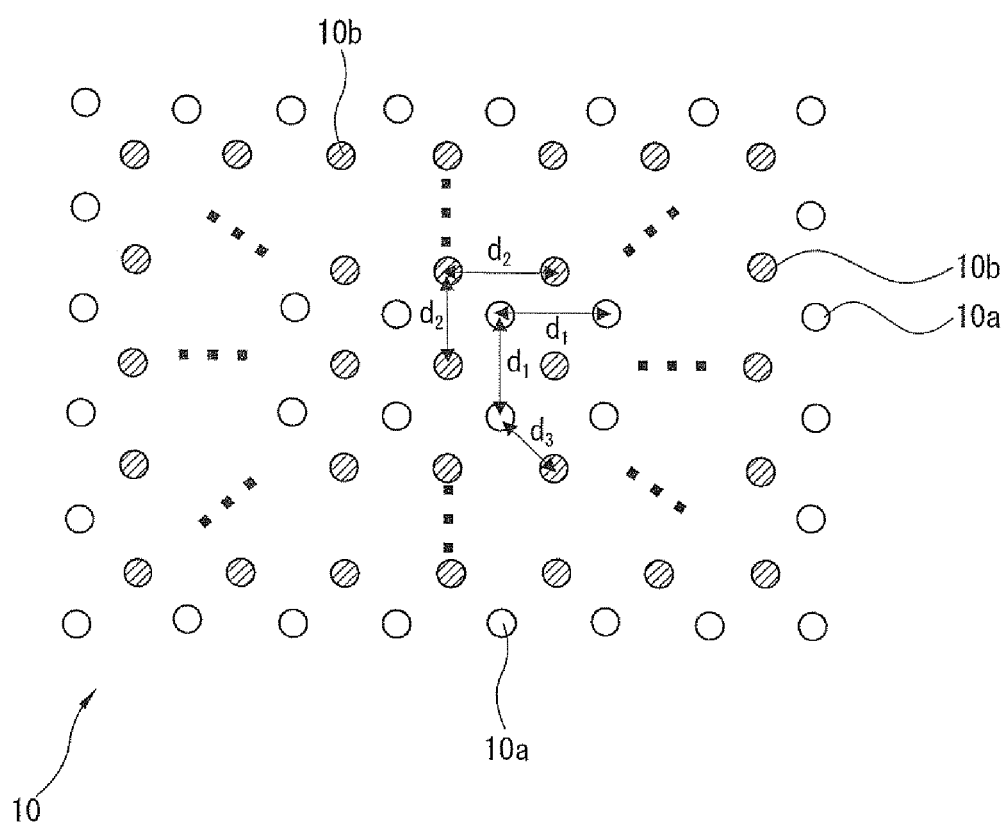
FIG. 4 is a view showing one example of holes formed in a shower head.
Figure 5:
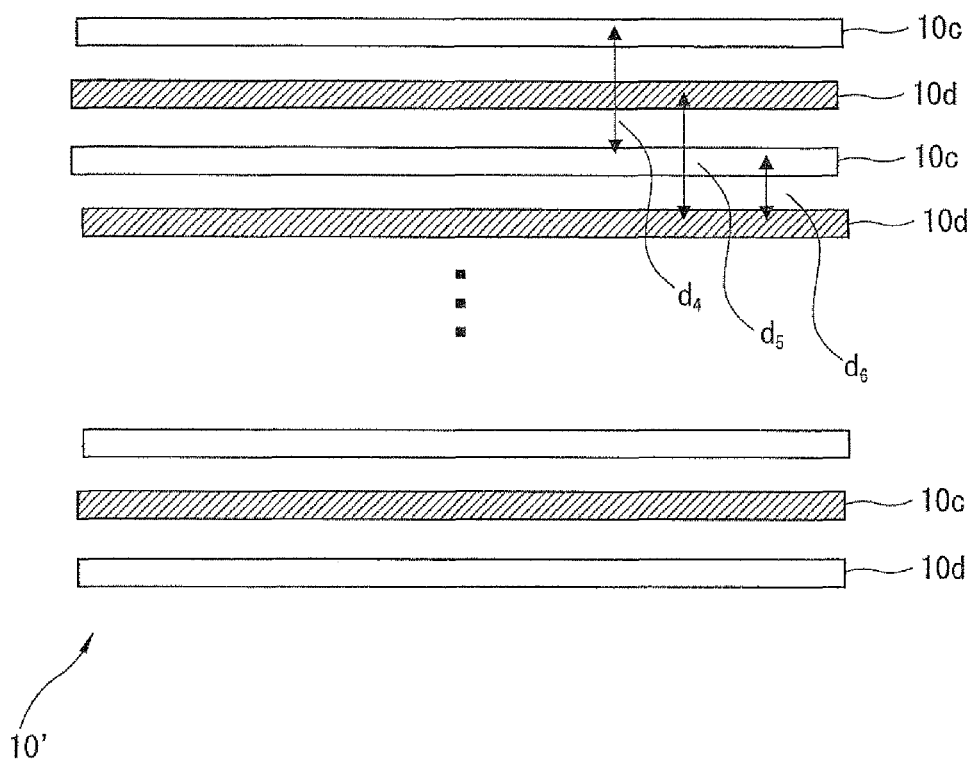
FIG. 5 is a view showing one example of slits formed in the shower head.

Here, with reference to FIGS. 4 and 5, holes 10a, 10b or slits 10c, 10d that are formed in the shower heads 10, 10' are explained in detail. In case that the holes 4a to 4c from which three different gases are ejected are formed like in the shower head 4, it is possible to form a uniform oxide film on the processing substrate 2 by making the distance between the hole 4a and the hole 4b, the distance between the hole 4a and the hole 4c, and the hole diameter of the holes 4a to 4c have the same distance $d_1$ to $d_3$ between the hole 10a and 10b and the same hole diameter as that of the holes 10a, 10b.

As shown in FIG. 4, the shower head 10 is formed with the holes 10a through which the high-concentration ozone gas passes, and the holes 10b through which the unsaturated hydrocarbon gas or the source gas passes. The holes 10a, 10b are respectively periodically arranged (to have a plane lattice shape such as rectangular lattice, square lattice, rhombic lattice or parallelotope lattice, or a concentric circular shape).

In the case of FIG. 4, the holes 10a are equidistantly arranged to have a rectangular lattice shape in two directions that are perpendicular to each other along the processing surface of the processing substrate 2 (in FIG. 4, two $d_1$ directions that are vertical and horizontal directions shown in the drawing). And, the holes 10b are at positions displaced from the holes 10a along the processing surface of the processing substrate 2 (in FIG. 4, at positions displaced by one half of the arrangement distance between the holes 10a (displaced toward the face center of a rectangular lattice of the holes 10a) and are equidistantly aligned in directions respectively parallel with the two directions (in FIG. 4, two $d_2$ directions that are vertical and horizontal directions shown in the drawing) to be arranged in a rectangular lattice shape. With this, in the shower head 10, there is provided a configuration where, at the position of the face center side of a rectangular lattice of one of the holes 10a, 10b, the other is positioned (for example, at the position of the face center side of a rectangular lattice of holes 10b, the hole 10a is positioned).

The distance between the hole 10a and the hole 10b is preferably narrow and is determined to avoid overlapping of the hole 10a and the hole 10b. The lattice distances $d_1$, $d_2$ of the holes 10a, 10b are, for example, preferably 1 mm to 100 mm, more preferably 5 mm to 30 mm. Furthermore, the distance $d_3$ between the hole 10a and the hole 10b is, for example, preferably 0.7 mm to 71 mm, more preferably 3.5 mm to 22 mm (or 7 mm to 35 mm). The distance $d_1$-$d_3$ is the distance between centers of the holes 10a, 10b. In this manner, as properly determining the distances of the holes 10a, 10b of the shower head 10, it is possible to form an oxide film with less offset on the processing substrate 2.

Furthermore, the hole diameter ϕ of the holes 10a, 10b is, for example, preferably 0.1 mm to 10 mm, more preferably 0.5 mm to 2 mm. The hole diameter of the holes 10a, 10b is determined in accordance with the shape of the gas buffer spaces 6a, 6b'. For example, in case that a large-sized gas buffer space 6a, 6b' cannot be taken, the gas flow rate and pressure tend to become uneven. Therefore, pressure loss is increased by reducing the hole diameter of the hole 10a, 10b. With this, uniformity of gas distribution of the gas buffer spaces 6a, 6b' improves.

As shown in FIG. 5, the shower head 10' is formed with slits 10c from which a high-concentration ozone gas is ejected, and slits 10d from which the unsaturated hydrocarbon gas or source gas is ejected. The slits 10c, 10d are alternately arranged to be adjacent in a short-length direction of each slit 10c, 10d. The distance $d_4$ between the slit 10c and the slit 10c and the distance $d_5$ between the slit 10d and the slit 10d are preferably 1 mm to 100 mm, more preferably 5 mm to 50 mm. Furthermore, the distance $d_6$ between the slit 10c and the slit 10d is preferably 0.5 mm to 50 mm, more preferably 2.5 mm to 25 mm. Each distance $d_4$-$d_6$ is the distance between centers of the slits.

Furthermore, the slit width of the slit 10c, 10d (the width of an opening section of the slit 10c, 10d in the short-length direction) is preferably 0.1 mm to 10 mm, more preferably 0.5 mm to 2 mm. The slit width of the slit 10c, 10d is determined by the shape of the gas buffer space 6a, 6b'. That is, in case that the gas flow rate and pressure are uneven due to that a large-sized buffer space 6a, 6b' cannot be taken, the slit width of the slit 10c (or slit 10d) is decreased to increase pressure loss. With this, uniformity of gas distribution of the gas buffer spaces 6a, 6b' is improved. The slit length of the slit 10c, 10d is suitably changed depending on the size of the processing substrate 2.

<<One example of ALD method>>

Next, an ALD method according to the first embodiment of the present invention is explained. In the explanation of the embodiment, there is shown an example in which TMA gas was used as the source gas, and ethylene gas was used as the unsaturated hydrocarbon gas. It is, however, possible to similarly form a thin film even in the case of using another source gas and another unsaturated hydrocarbon gas, which are mentioned above (ALD methods according to the after-mentioned second and third embodiments are also similar). For example, in the case of using source gases containing Hf, Ti, Zn, Ta, Mo, Ru, Si, Zr and Y elements, $HfO_2$, $TiO_2$, ZnO, $Ta_2O_3$, $MoO_3$, $RuO_2$, $SiO_2$, $ZrO_2$ and $Y_2O_3$ are respectively formed on the processing substrates 2.

Figure 6:
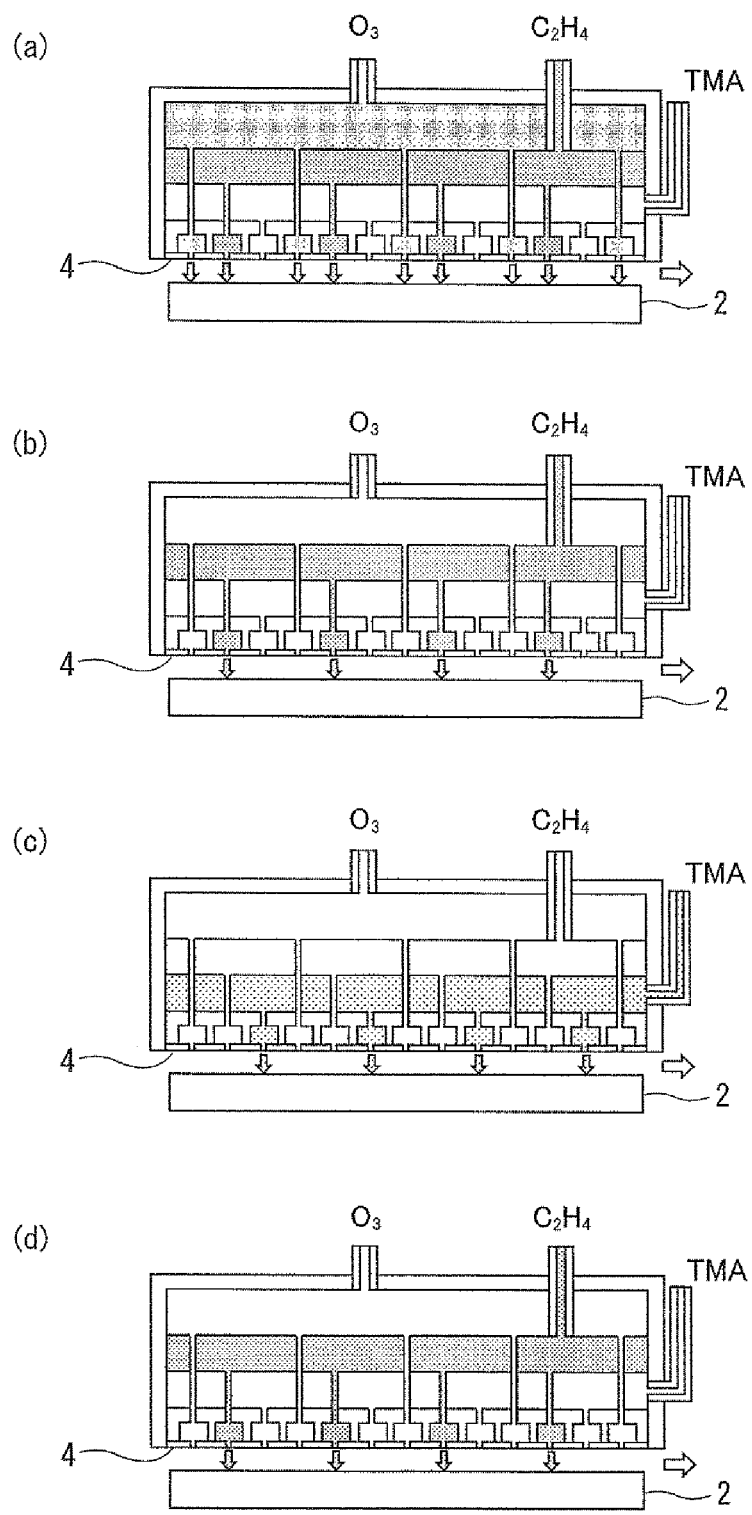

Firstly, as shown in FIG. 6(a), a high-concentration ozone gas (100% volume %) and ethylene gas are supplied from the shower head 4, and the high-concentration ozone gas and ethylene gas are mixed together in the vicinity of the surface of the processing substrate 2, thereby making OH* as the oxidizing agent act on the processing substrate 2 (an oxidizing agent supplying step). At the first time of this step, OH* acts on the processing substrate 2, thereby uniformly forming TMA's bonding sites on the surface of the processing substrate 2. Then, at the second time or later of this step, TMA adsorbed onto the surface of the processing substrate 2 is oxidized. Upon this, OH* acts on the oxide film, thereby uniformly forming TMA's bonding sites for the next film formation on the surface of the oxide film. That is, the oxidizing agent supplying step conducted at the first time is a preprocessing step of the processing substrate 2, and the oxidizing agent supplying step conducted at the second time or later is an oxidization step of TMA adsorbed onto the processing substrate 2. In the oxidizing agent supplying step, a pathway is closed to prevent TMA from being ejected from the shower head 4.

Next, as shown in FIG. 6(b), ethylene gas supply to the vacuum container 3 is continued, thereby purging the gas supplied to the oxidizing agent supplying step, to the outside of the vacuum container 3 (the oxidizing agent purging step). By continuing ethylene gas supply from the shower head 4, the reaction gases such as OH* remaining in the vacuum container 3 are removed to the outside of the vacuum container 3. In this step, pathways are closed to prevent the high-concentration ozone gas and the TMA gas from being ejected from the shower head 4. In a condition that the high-concentration ozone gas does not exist, ethylene hardly reacts with TMA, thereby preventing contamination of the inside of the vacuum container 3. Therefore, the purging gas is preferably an unsaturated hydrocarbon gas such as ethylene gas. Furthermore, it is possible to use an inert gas such as nitrogen gas as the purging gas, but it is not necessary to newly provide an inlet of the inert gas by using ethylene gas. This is preferable. Furthermore, there is a possibility that TMA reacts with water to generate particles. Therefore, it is preferable that the purging gas (here, ethylene gas or another inert gas) has a dew point as low as possible. Ideally, it is more preferable that the purging gas has an atmospheric dew point of −50° C. or lower. Dew point of the purging gas in the after-mentioned source gas purging step is also similar.

Next, as shown in FIG. 6(c), TMA gas is introduced into the vacuum container 3, such that TMA is adsorbed on the surface of the processing substrate 2 (the source gas supplying step). in this step, for example, TMA is adsorbed by only one molecular layer on the surface of the processing substrate 2.

Next, as shown in FIG. 6(d), ethylene gas is supplied to the vacuum container 3 to remove (purge) $CH_4$ gas to be generated when TMA gas is adsorbed on the processing substrate 2, excess of TMA gas existing in the vacuum container 3, etc. (the source gas purging step). In this step, pathways are closed to prevent the high-concentration ozone gas and the TMA gas from being ejected from the shower head 4. Similar to the oxidizing agent purging step, it is possible to use an inert gas such as nitrogen gas as the purging gas.

Then, as shown in FIG. 6(a), the high-concentration ozone gas and ethylene gas are supplied again from the shower head 4, such that TMA adsorbed on the surface of the processing substrate 2 is oxidized (the oxidizing agent supplying step).

By repeating the four steps shown in these FIG. 6(a) to FIG. 6(d), an oxide film having a predetermined film thickness is formed on the processing substrate 2. The number of repeating the four steps is determined by the required film thickness of the oxide film and the film thickness of the oxide film formed by one cycle.

Figure 7:
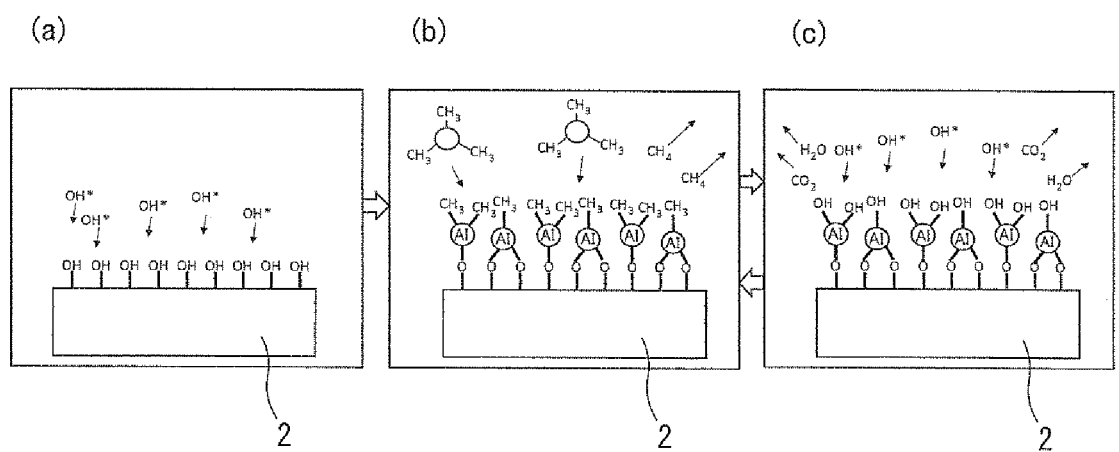

As shown in FIG. 7(a), in the oxidizing agent supplying step at the first time, OH* generated by a reaction between ozone and ethylene acts on the processing substrate 2, thereby uniformly forming bonding sites (OH groups) for the film formation on the surface of the processing substrate 2. The reaction gas such as OH* is discharged to the outside of the vacuum container 3 in the oxidizing agent purging step.

Next, as shown in FIG. 7(b), in the source gas supplying step, TMA gas is supplied to the vacuum container 3, such that TMA is adsorbed onto the bonding sites on the surface of the processing substrate 2. $CH_4$ gas that is generated by adsorption of TMA gas onto the processing substrate 2 and TMA gas that was not adsorbed onto the processing substrate 2 are discharged to the outside of the vacuum container 3 in the source gas purging step.

Then, as shown in FIG. 7(c), in the oxidizing agent supplying step, the high-concentration ozone gas and, ethylene gas are supplied to the vacuum container 3. With this, OH* is generated by a reaction between ozone and ethylene. This OH* oxidizes methyl group ($CH_3$) on the surface of the processing substrate 2, such that bonding sites (OH groups) for the next film formation are uniformly formed on the surface of the processing substrate 2. This oxidization is possible at room temperature (25° C.), too.

Figure 8:
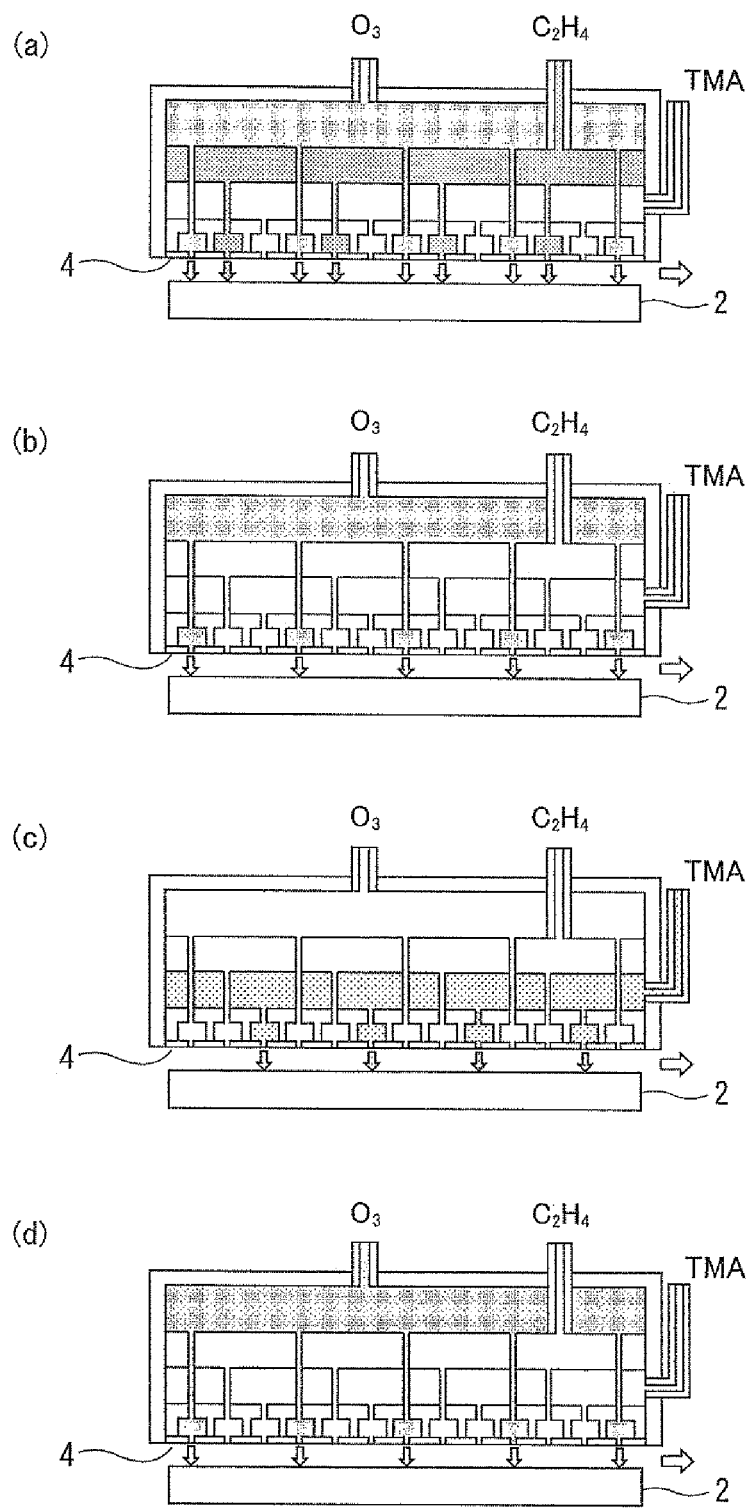

FIG. 8 is an explanatory view that explains an ALD method according to the second embodiment of the present invention. This method is one in which a high-concentration ozone gas is used as the purging gas in one or both of the oxidizing agent purging step and the source gas purging step of the ALD method according to the first embodiment. Therefore, detailed explanations of the oxidizing agent supplying step and the source gas supplying step, which are similar to those of the first embodiment, are omitted.

Firstly, as shown in FIG. 8(a), the high-concentration ozone gas and ethylene gas are supplied from the shower head 4 to mix together the high-concentration ozone and ethylene in the vicinity of the surface of the processing substrate 2, thereby making OH* as the oxidizing agent act on the surface of the processing substrate 2 (the oxidizing agent supplying step).

Next, as shown in FIG. 8(b), it is continued to supply the high-concentration ozone gas to the vacuum container 3, thereby removing (purging) gases provided in the oxidization agent supplying step to the outside of the vacuum container 3 (the oxidizing agent purging step). Upon this, as it is continued to supply the high-concentration ozone gas from the shower head 4, the reaction gases such as OH* remaining in the vacuum container 3 are removed to the outside of the vacuum container 3. In this step, pathways are closed to prevent ethylene gas and TMA gas from being ejected from the shower head 4. The high-concentration ozone gas is an active gas. It is, however, extremely low in activity at a temperature of 100° C. or lower. Therefore, it can be used as the purging gas. Furthermore, it is possible to use an inert gas such as nitrogen gas as the purging gas, but it is not necessary to newly provide an inlet of the inert gas by using the high-concentration ozone gas.

Next, as shown in FIG. 8(c), TMA gas is introduced into the vacuum container 3, such that TMA is adsorbed onto the surface of the processing substrate 2 (the source gas supplying step). In this step, for example, TMA is adsorbed by only one molecular layer on the surface of the processing substrate 2.

Next, as shown in FIG. 8(d), the high-concentration ozone gas is supplied to the vacuum container 3 to remove (purge) $CH_4$ gas to be generated when TMA gas is adsorbed on the processing substrate 2, an excess of TMA gas existing in the vacuum container 3, etc. (the source gas purging step). In this step, pathways are closed to prevent ethylene gas and the TMA gas from being ejected from the shower head 4. Similar to the oxidizing agent purging step, it is possible to use an inert gas such as nitrogen gas as the purging gas.

Then, as shown in FIG. 8(a), the high-concentration ozone gas and ethylene gas are supplied again from the shower head 4 to oxidize TMA adsorbed on the surface of the processing substrate 2 (the oxidizing agent supplying step).

In this way, in the ALD method according to the second embodiment of the present invention, the above-mentioned four steps are repeated to form an oxide film having a predetermined film thickness on the processing substrate 2. The number of repeating the four steps is determined by the required film thickness of the oxide film and the film thickness of the oxide film formed by one cycle.

Figure 9:
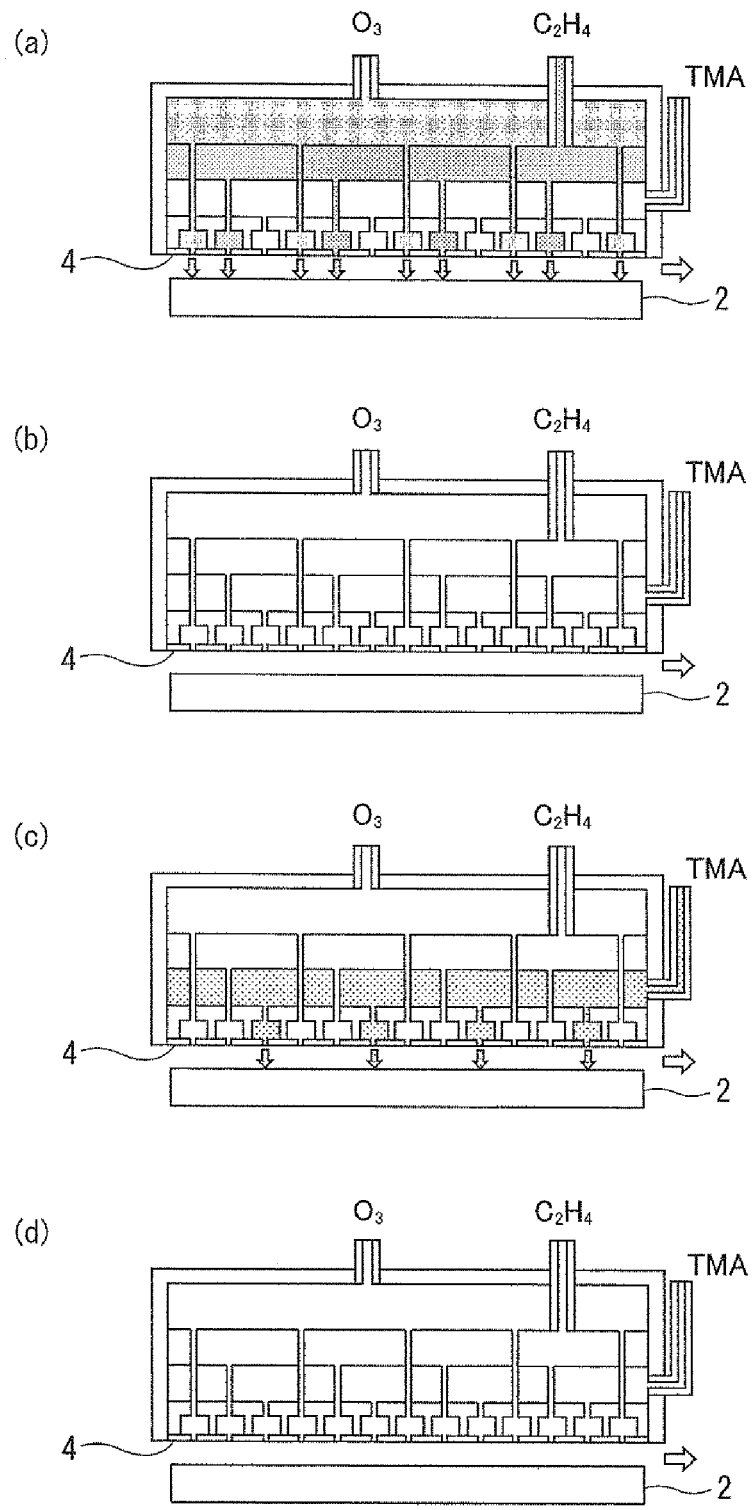

FIG. 9 is an explanatory view that explains an ALD method according to the third embodiment of the present invention. This method is one in which the oxidizing agent or the source gas is purged by evacuation from the vacuum container 3 in one or both of the oxidizing agent purging step and the source gas purging step of the ALD method according to the first embodiment. Therefore, detailed explanations of the oxidizing agent supplying step and the source gas supplying step, which are similar to those of the first embodiment, are omitted. The ALD method according to the third embodiment takes more time for conducting the purging steps than the ALD methods according to the first and second embodiments, but is capable of forming a uniform oxide film on the surface of the processing substrate 2.

Firstly, as shown in FIG. 9(*a*), the high-concentration ozone gas and ethylene gas are supplied from the shower head 4 to mix together the high-concentration ozone and ethylene in the vicinity of the surface of the processing substrate 2, thereby making OH* as the oxidizing agent act on the surface of the processing substrate 2 (the oxidizing agent supplying step).

Next, as shown in FIG. 9(*b*), the vacuum container 3 is evacuated, thereby removing (purging) gases provided in the oxidization agent supplying step and the reaction gases such as OH* to the outside of the vacuum container 3 (the oxidizing agent purging step). In this step, pathways are closed to prevent the high-concentration ozone gas, ethylene gas and TMA gas from being ejected from the shower head 4.

Next, as shown in FIG. 9(*c*), TMA gas is introduced into the vacuum container 3, such that TMA is adsorbed onto the surface of the processing substrate 2 (the source gas supplying step). In this step, for example, TMA is adsorbed by only one molecular layer on the surface of the processing substrate 2.

Next, as shown in FIG. 9(*d*), the vacuum container is evacuated to remove (purge) $CH_4$ gas to be generated when TMA gas is adsorbed on the processing substrate 2, an excess of TMA gas existing in the vacuum container 3, etc. (the source gas purging step). In this step, pathways are closed to prevent the high-concentration ozone gas, ethylene gas and the TMA gas from being ejected from the shower head 4.

Then, as shown in FIG. 9(*a*), the high-concentration ozone gas and ethylene gas are supplied again from the shower head 4 to oxidize TMA adsorbed on the surface of the processing substrate 2 (the oxidizing agent supplying step).

In this way, in the ALD method according to the third embodiment of the present invention, the above-mentioned four steps are repeated to form an oxide film having a predetermined film thickness on the processing substrate 2. The number of repeating the four steps is determined by the required film thickness of the oxide film and the film thickness of the oxide film formed by one cycle.

In the ALD method according to the first to third embodiments, a monolayer film of aluminum oxide was formed. By applying this method, it is possible to form a multi-layer film in which oxide films having different compositions are stacked on the processing substrate 2.

For example, in a process of repeating the four steps of the ALD methods according to the first to third embodiments, if the source gas supplied in the source gas supplying step is changed to another source gas, it is possible to form a multi-layer film.

Furthermore, in a process of repeating the four steps of the ALD methods according to the first to third embodiments, if conducting a CVD process (e.g., CVD process described in Non-patent Publication 3) before and after the ALD film formation process, it is possible to form a multi-layer film having an ALD film and a CVD film on the same processing substrate 2. It becomes possible to form at low temperatures a multi-layer film having multi-functionality not achievable by a mono-layer film, for example, by forming $SiO_2$ films high in elastic yield strength by CVD that makes a high-speed film formation possible and by forming between the $SiO_2$ films an $Al_2O_3$ film high in water vapor permeability. Furthermore, in the ALD apparatus 1, 1' shown in FIG. 1 or FIG. 2, if controlling timing of the gas supply, it becomes possible to form a CVD/ALD multi-layer film in the same vacuum container 3 (chamber). That is, the ALD apparatus 1, 1' according to the embodiment of the present invention as a single apparatus makes it possible to form an ALD film by alternating supply of the source gas and supply of ozone gas and the unsaturated hydrocarbon gas, and to form a CVD film by simultaneously supplying the source gas, the unsaturated hydrocarbon gas and ozone gas.

EXAMPLES

Figure 2:
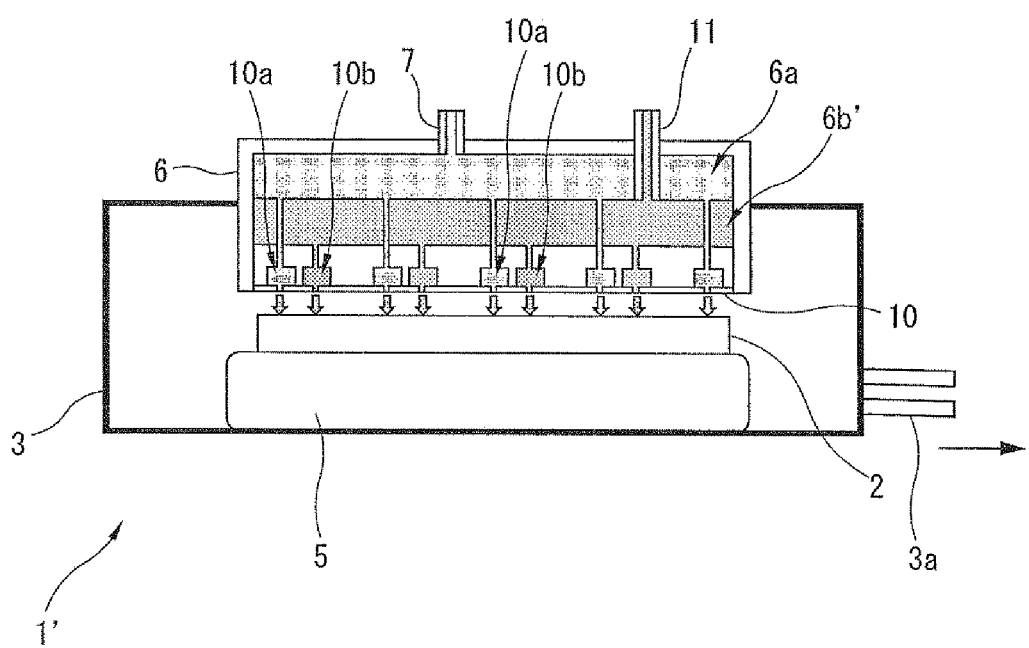
FIG. 2 is a schematic view of an ALD apparatus according to another embodiment of the present invention.
Figure 3:
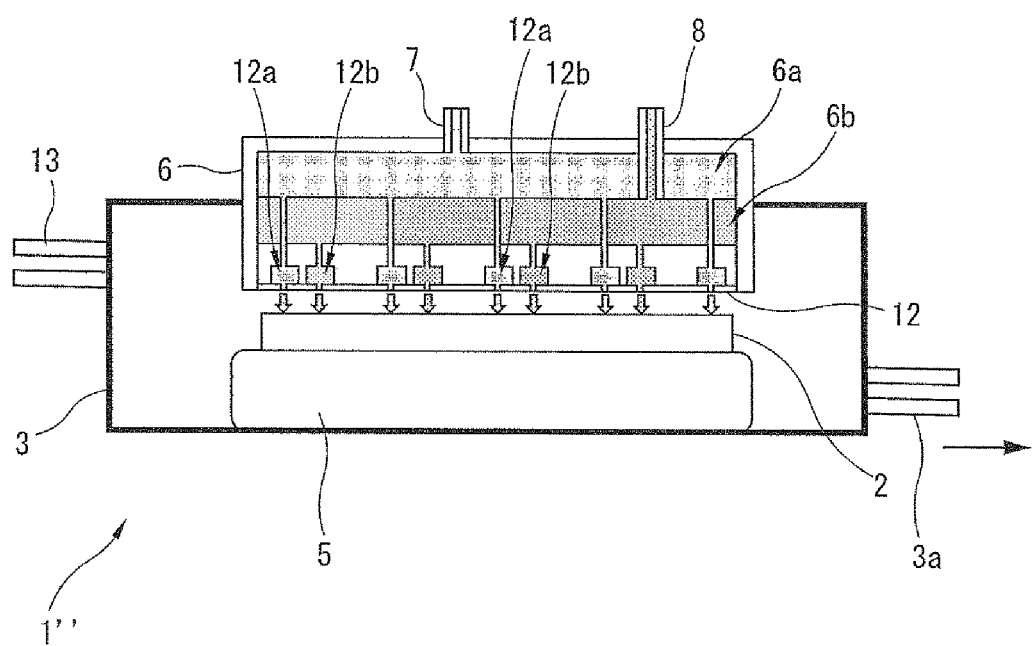
FIG. 3 is a schematic view of an ALD apparatus according to another embodiment of the present invention.
Figure 10:
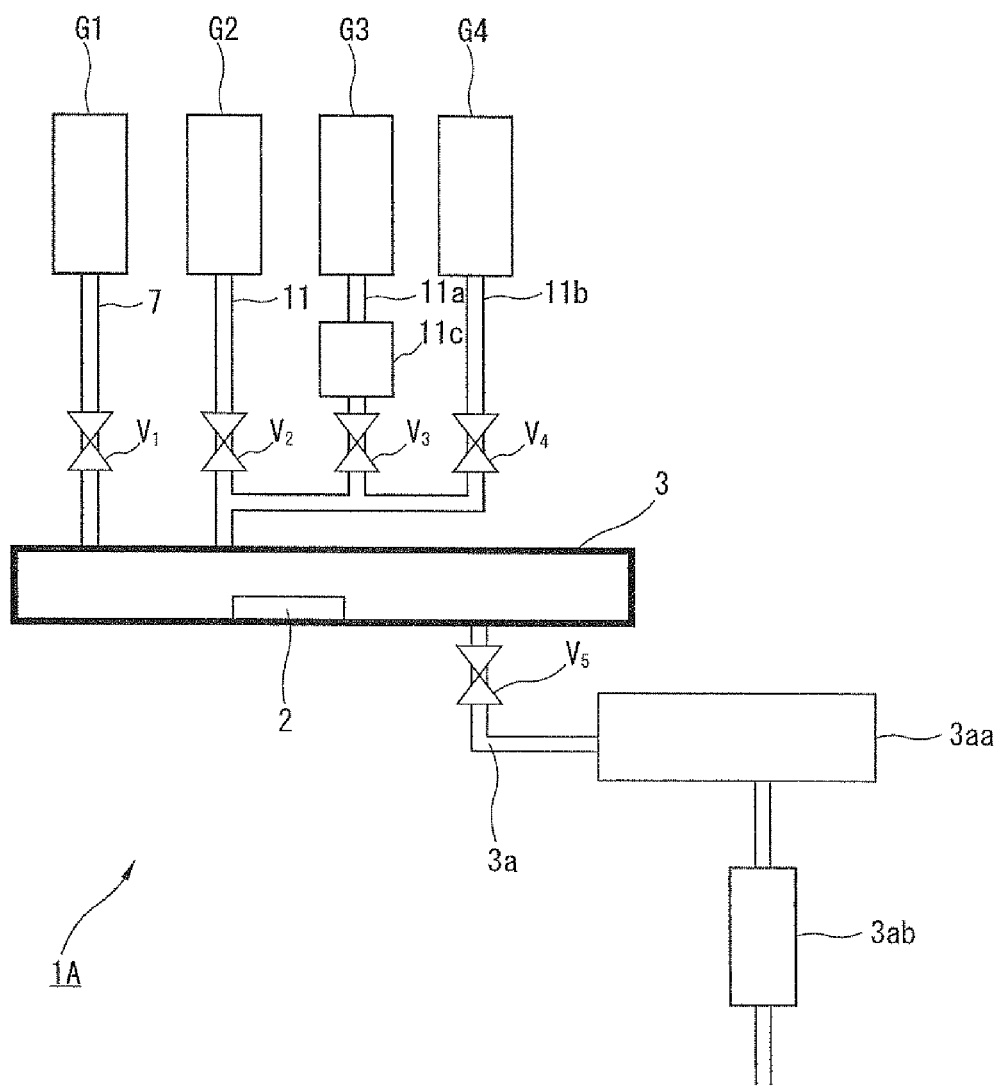
FIG. 10 is a schematic view of an ALD apparatus in the embodiment.
Figure 11:
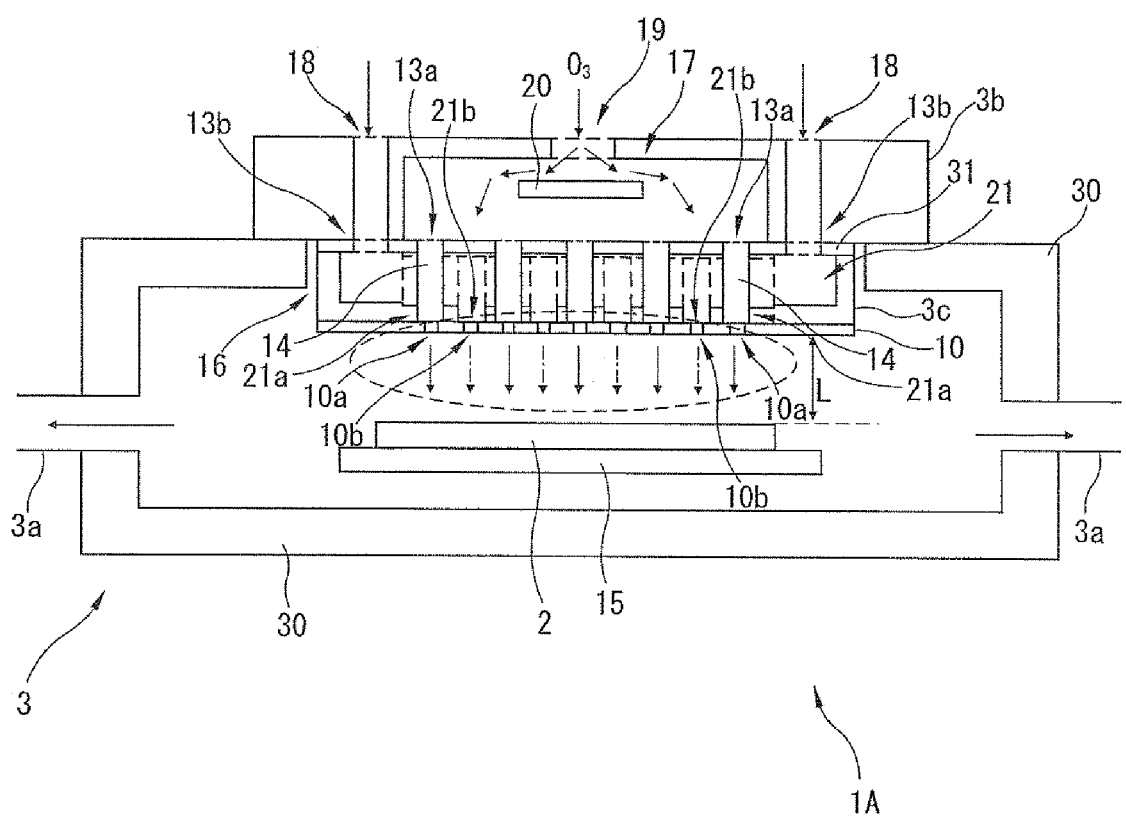
FIG. 11 is a schematic view showing more details of a vacuum container of the ALD apparatus in the embodiment.

Next, as a concrete example of the ALD apparatus 1' shown in FIG. 2, an ALD apparatus 1A as shown in FIG. 10 and FIG. 11 was constructed. With this ALD apparatus 1A, an ALD film was formed by the after-mentioned film formation conditions. Then, this ALD film's thickness distribution, insulation characteristic and water vapor permeability characteristic were examined. Those similar to FIG. 1 to FIG. 9 and the first to third embodiments are designated by the same signs, and their detailed explanations are suitably omitted.

<Schematic configuration of ALD apparatus 1A>

As shown in FIG. 10, the ALD apparatus 1A is equipped mainly with an ozone gas generator G1 (or a cylinder filled with a high-concentration ozone gas), an unsaturated hydrocarbon gas cylinder G2, a source gas cylinder G3, an inert gas cylinder G4, and a vacuum container 3 (chamber) for conducting the film formation.

The ozone gas generator G1 supplies ozone gas to the vacuum container 3. The ozone gas generator G1 is connected to the vacuum container 3 through a pipe 7. The pipe 7 is provided with a flow-rate variable valve $V_1$ for independently controlling flow rate of ozone gas. Flow rate of the pipe 7 is calculated, for example, based on the pressure difference between the primary pressure and the secondary pressure of the valve $V_1$ and the cross-sectional area of the pipe 7. In such ozone gas flow rate measurement, it is preferable to use an apparatus that is equipped with a system to measure flow rate by the pressure difference. This is because decomposition of ozone occurs by using a measurement apparatus of a type of heat addition.

The unsaturated hydrocarbon gas cylinder G2 supplies an unsaturated hydrocarbon gas to the vacuum container 3. The unsaturated hydrocarbon gas cylinder G2 is connected to the vacuum container 3 through a pipe 11. The pipe 11 is provided with a flow-rate variable valve $V_2$ for independently controlling flow rate of the unsaturated hydrocarbon gas. Although not shown in the drawings, the pipe 11 is equipped with a measuring apparatus for measuring flow rate of the unsaturated hydrocarbon gas, such as mass flow meter.

The source gas cylinder G3 supplies the source gas to the vacuum container 3. The source gas cylinder G3 is connected to the vacuum container 3 through a pipe 11a and a pipe 11. The pipe 11a is provided with a flow rate variable valve $V_3$ to independently control flow rate of the source gas. Flow rate of the source gas is calculated, for example, based on the pressure difference between the primary pressure and the secondary pressure of the valve $V_3$ and the cross-sectional area of the pipe 11a. Furthermore, the pipe 11a is equipped with a vaporizing chamber 11c. For example, in the vaporizing chamber 11c, the source is heated at 70° C. or higher, and the source that is liquid at normal temperature is vaporized in the vaporizing chamber 11c and then is supplied as the source gas to the vacuum container 3

The inert gas cylinder G4 supplies an inert gas as a carrier gas for carrying the unsaturated hydrocarbon gas and the source gas to the vacuum container 3. The inert gas cylinder G4 is connected to the vacuum container 3 through a pipe 11b, the pipe 11a, and the pipe 11. The pipe 11b is provided with a flow rate variable valve $V_4$ to independently control flow rate of the inert gas. The inert gas supplied from the inert gas cylinder G4 makes it possible to stir or purge gases in the vacuum container 3.

An exhaust pipe 3a is connected to the vacuum container 3. This exhaust pipe is equipped with a vacuum pump 3aa and an excluding tube 3ab for decomposing the residual gas after exhaust. The gases in the vacuum container 3 are released to the air through this excluding tube 3ab. The exhaust pipe 3a is provided with a flow rate variable valve $V_5$, and this valve $V_5$ controls pressure of the vacuum container 3 during the film formation process.

FIG. 11 shows further details of the vacuum container 3 of the ALD apparatus 1A. The vacuum container 3 of FIG. 11 is equipped with a housing 30 in which the processing substrate 2 is disposed, a lid 3b, and a gas diffusion section 3c. The lid 3b is provided with a shielding plate 31 on an inner side of the housing 30. The lid 3b is provided with the gas diffusion section 3c via the shielding plate 31. The gas diffusion section 3c is provided with the shower head 10 on a surface that is opposite to the surface on which the shielding plate 31 is provided. For example, each component constituting the vacuum container 3 has a structure fixed in a vacuum way such that pressure of the vacuum container 3 can reach 1 Pa or lower.

The shielding plate 31 is formed with passing holes 13a through which ozone gas passes, and holes 13b through which the unsaturated hydrocarbon gas and the source gas pass alternately. Furthermore, the hole 13a is equipped on its side, where the gas diffusion section 3c is provided, with an ozone gas passing section 14 through which ozone gas passes. The ozone gas passing section 14 is, for example, a tubular member. As ozone gas that passed through the hole 13a of the shielding plate 31 passes through the ozone gas passing section 14, ozone gas is supplied into the housing 30 without mixing of the ozone gas with other gases in the gas diffusion section 3c.

The housing 30 is formed, for example, of aluminum or SUS material (stainless steel) (the lid 3b, the gas diffusion section 3c and the shielding plate 31 are similar). The housing 30 is equipped with a supporting base 15 (substrate susceptor), and the processing substrate 2 is placed on the supporting base 15.

The supporting base is formed, for example, of quartz glass or SiC material, besides aluminum or SUS material. Furthermore, for the purpose of, for example, improving film formation performance, heating (e.g., heating by a heating mechanism such as thermocouple or infrared heater; not shown in the drawings) may be suitably conducted. As a specific example, it is possible to cite a heating according to need such that temperature of the processing substrate 2 falls in a range of from around room temperature to 100° C.

The lid 3b is provided to cover an opening 16 formed on an upper part of the housing 30. The lid 3b is formed with an ozone gas buffer space 17 and a gas passing section 18.

The ozone gas buffer space 17 has an opening on the side of the housing 30, and the shielding plate 31 is provided to cover this opening. The ozone gas buffer space 17 is equipped on its upper part with an ozone gas introducing section 19 to be connected to the pipe 7. Ozone gas is supplied from the pipe 7 to the ozone gas buffer space 17 through the ozone gas introducing section 19. Furthermore, the ozone gas buffer space 17 is equipped with a gas flow diffusion plate 20.

The gas passing section 18 is formed to pass through the lid 3b. The pipe 11 is connected to an end portion of the gas passing section 18 on an outer side of the housing 30. Furthermore, an end portion of the gas passing section 18 on an inner side of the housing communicates with the inside of the gas diffusion section 3c through the hole 13b formed in the shielding plate 31. Therefore, the unsaturated hydrocarbon gas and the source gas, which are alternately supplied, are supplied (supplied, for example, together with carrier gas) to the inside of the gas diffusion section 3c from the pipe 11 through the gas passing section 18. The gas passing section 18 is provided by at least one at around the ozone gas buffer space 17.

If the gas passing sections 18 are equidistantly provided to surround the ozone gas buffer space 17, it is possible to reduce unevenness of flow rate of the unsaturated hydrocarbon gas or the source gas. Furthermore, flow passage cross-sectional area of the gas passing section 18 is, for example, the same as that of the pipe 11 to be connected to the gas passing section 18.

The gas flow diffusion plate 20 has, for example, a circular plate shape and is arranged to be opposed to the opening surface of the ozone gas introducing section 19. The gas flow diffusion plate 20 is provided at a roof portion of the ozone gas buffer space 17 by a hook, etc. By making the gas flow diffusion plate 20 have a size that is larger than that of the opening surface of the ozone gas introducing section 19, the ozone gas flowed from the ozone gas introducing section 19 is prevented from blowing directly against the shielding plate 31. This is preferable. Furthermore, as the gas flow diffusion plate 20 becomes larger, flow resistance of the ozone gas passing in the vicinity of the gas flow diffusion plate 20 increases. Therefore, diameter of the gas flow diffusion plate 20 is preferably, for example, about one half of the cross-sectional area of the ozone gas buffer space 17. Furthermore, the gas flow diffusion plate 20 is provided at a mid-position between the roof portion of the ozone gas buffer space 17 and the shielding plate 31 or a position that is displaced from the mid-position toward the side of the ozone gas introducing section. It is preferable that the gas flow diffusion plate 20 has a thickness as thin as possible.

The gas diffusion section 3c is a box body having an opening at an end portion that is in contact with the shielding plate 31. A gas buffer space 21 is formed by an inner wall surface of the gas diffusion section 3c and the shielding plate 31. The gas diffusion section 3c is formed, in its end surface contact with the shower head 10, with holes 21a through which ozone gas passes, and holes 21b through which the unsaturated hydrocarbon gas and the source gas pass alternately. The hole 21a is provided with the ozone gas passing section 14.

The shower head 10 is provided to be opposed to the surface of the processing substrate 2. The shower head 10 is formed with holes 10a from which ozone gas is ejected, and holes 10b from which the unsaturated hydrocarbon gas and the source gas are alternately ejected. The holes 10a, 10b are respectively periodically arranged (to have a plane lattice shape such as rectangular lattice, rhombic lattice or parallelotope lattice, or a concentric circular shape). The shower head is formed, for example, of quartz glass or SiC material, besides aluminum or SUS material. By adjusting the distance L between an end surface (gas supplying surface) of the shower head 10 and the surface of the processing substrate 2 to, for example, 1 mm to 100 mm, more preferably 5 mm to 30 mm, unevenness of the film thickness of the ALD film to be formed on the processing substrate 2 becomes less. Therefore, it is preferable.

In the ALD apparatus 1A shown above, there is suitably conducted a cycle of four steps (the source gas supplying step, the source gas purging step, the oxidizing agent supplying step, and the oxidizing agent purging step) (hereinafter, suitably referred to as simply film formation cycle) of the ALD method as shown in FIGS. 7(a) to 7(c) (for example, each valve $V_1$ to $V_4$ is independently switched to suitably control supply timing of each gas and to suitably conduct purging). With this, similar to the first to third embodiments, it becomes possible to form a desired ALD film, etc. on the processing substrate 2.

Figure 12:
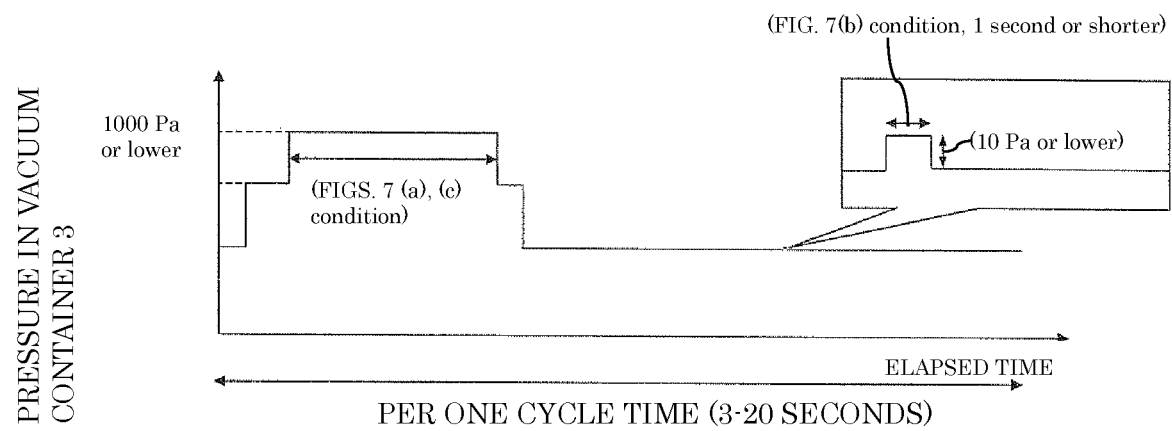
FIG. 12 is a view showing a pressure variation characteristic of a cycle of four steps (a source gas supplying step, a source gas purging step, an oxidizing agent supplying step, and an oxidizing agent purging step) of the ALD apparatus in the embodiment.

It is possible to mention that the maximum pressure of the vacuum container 3 is controlled to become 1000 Pa or lower. For example, pressure of the vacuum container 3 per one film formation cycle (3 to 20 seconds) is suitably controlled to become a pressure variation characteristic as shown in FIG. 12. In the case of pressure of the vacuum container 3 shown in FIG. 12, the oxidizing agent supplying step (the condition shown in FIGS. 7(a) & 7(c)) is controlled to 1000 Pa or lower, and the source gas supplying step (the condition shown in FIG. 7(b)) is controlled to 10 Pa or lower (and 1 second or shorter in supply time) as shown in an enlarged fragmentary view of FIG. 12 (a balloon drawing on the right side shown in the drawing). Furthermore, supply time of the ozone gas and the unsaturated hydrocarbon gas per 1 film formation cycle is set at 0.1 seconds or longer.

By suitably controlling pressure variation and the source gas supply time of the source gas supplying step, it is possible to control the amount of adsorption of the source gas against the processing substrate.

The inert gas supply amount of the inert gas cylinder G4 may be suitably changed in the middle of the film formation cycle, for example, for the purpose of controlling the amount of adsorption of the source gas against the processing substrate 2. For example, in the film formation cycle, it is possible to mention that there are conducted the first step to supply a predetermined flow rate (e.g., 1 LSM or lower) of inert gas as the carrier gas, and the second step to resume supply of the inert gas at a flow rate (e.g., over 1 LSM) that is higher than that of the first step after stopping (e.g., stopping for several seconds) supply of the carrier gas in the first step. By suitably conducting these first and second steps (for example, alternately repeating them), for example, it becomes possible to remove an excess of the source gas adsorbed against the processing substrate 2 from the surface of the processing substrate 2.

In the case of suppressing the gas retention time in the vacuum container 3, it is possible to mention that exhaust from the exhaust pipe 3a is always turned to an exhaust condition (a reduced pressure atmospheric condition in the vacuum container 3), and an inert gas of the inert gas cylinder G4 is intermittently supplied (e.g., at 1 LSM or lower) as the purging gas.

<Film formation condition of ALD film>

In the ALD apparatus 1A, the film formation cycle was repeated a plural times to suitably supply an ozone gas (ozone concentration: 90 volume %), ethylene gas and TMA gas to a Si substrate (the processing substrate 2), thereby forming ALD films by $Al_2O_3$ against the Si substrate to make samples S1 (film formation cycle: 150 times) and S2 (film thickness: 17.4 nm). A sample S3 was made by applying a PEN film in place of the Si substrate and forming an ALD film by $Al_2O_3$ against the PEN film.

Temperature of the Si substrate and the PEN film was set at room temperature (25° C.), and the amounts of supply of ozone gas and ethylene gas were respectively set at 200 sccm and 64 sccm. The supply time of ozone gas and ethylene gas per one film formation cycle was set at 5 seconds.

Furthermore, argon gas was used as the carrier gas to be supplied from the inert gas cylinder G4, and the amount of supply of this argon gas was set to be constant at 95 sccm or higher.

The maximum pressure of the vacuum container 3 was set at around 40 Pa or lower. Pressure variation and supply time in the case of supplying TMA gas (the source gas supplying step) were respectively set at about 0.01 Pa and 0.1 seconds.

<Film thickness distribution>

Figure 13:
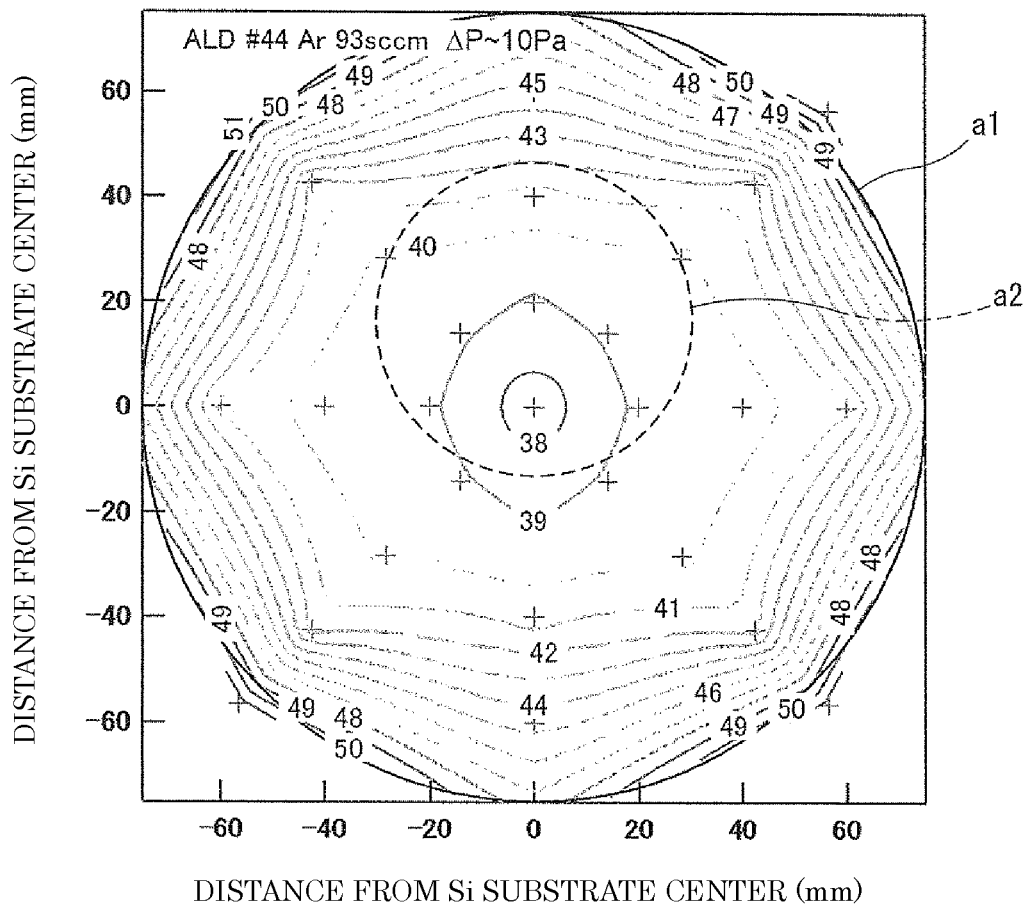
FIG. 13 is a view showing a film thickness distribution on the ALD film Sa surface of a sample S1 in the embodiment.

FIG. 13 shows the results obtained by measuring the film thickness distribution in the surface direction in the ALD film surface of sample S1. In FIG. 13, cross signs in the drawing indicate the film thickness input points when measuring the film thickness of the ALD film surface. It is a drawing in which the film thickness values measured in the second quadrant were applied to measurement points of the other quadrants by assuming circular symmetry distribution.

According to FIG. 13, in a region a1 (φ: 150 mm) opposed to the shower head 10 on the ALD film surface, the film thickness of the ALD film was 38 nm to 50 nm, which can be read as being ±14% or less in terms of film thickness uniformity. This film thickness uniformity can be improved, for example, by suitably optimizing configuration of the shower head 10 or suitably optimizing TMA gas supply distribution.

Furthermore, of the region a1, in a region a2 (φ: 60 mm) on the side is of a Si substrate central part, the film thickness of the ALD film was 38 nm to 42 nm, which can be read as being ±5% or less in terms of film thickness uniformity and as obtaining a relatively good result.

<Insulating Characteristic>

Figure 14:
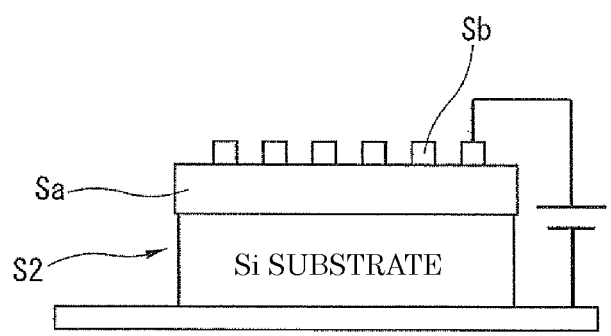
FIG. 14 is view showing an MIS capacitor configuration of a sample S2 in the embodiment.
Figure 15:
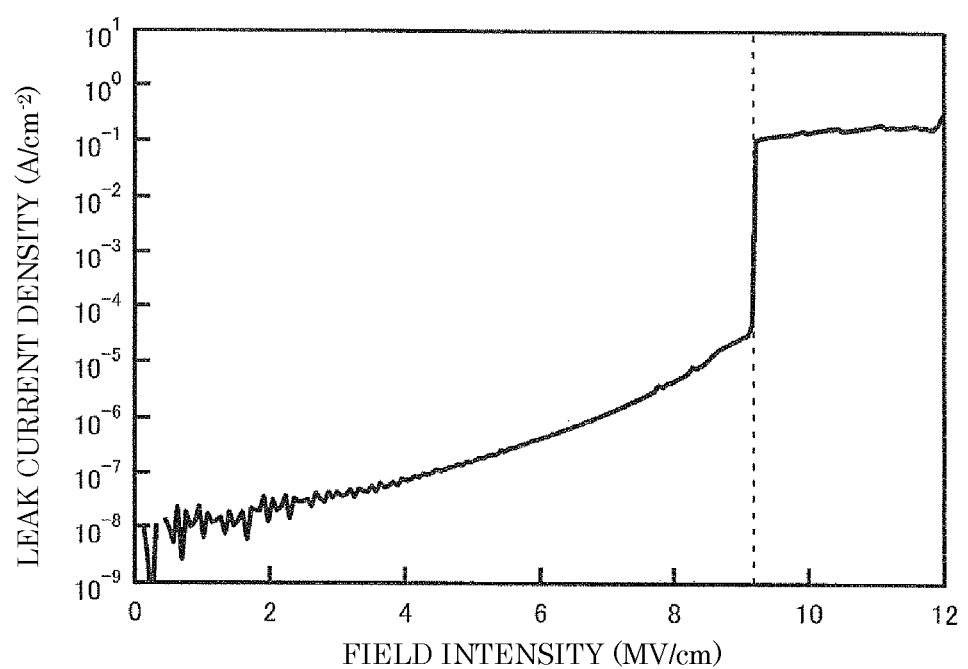
FIG. 15 is a view showing a leak current density characteristic relative to field strength of an ALD film Sa of a sample S2 in the embodiment.

In the sample S2, as shown in FIG. 14, a plurality of Al electrodes (φ: 500 μm) were formed on the surface of the ALD film Sa by vapor deposition, thereby making a MIS capacitor configuration. As an energization test was conducted by an energization between the bottom surface side in the sample S2 (Si substrate bottom surface side) and the Al electrode Sb, there was obtained a leak current density characteristic relative to the field intensity as shown in FIG. 15. According to FIG. 15, it can be read that a sufficient insulating characteristic has been obtained in the ALD film Sa of the sample S2.

<Water vapor permeability>

Figure 16:
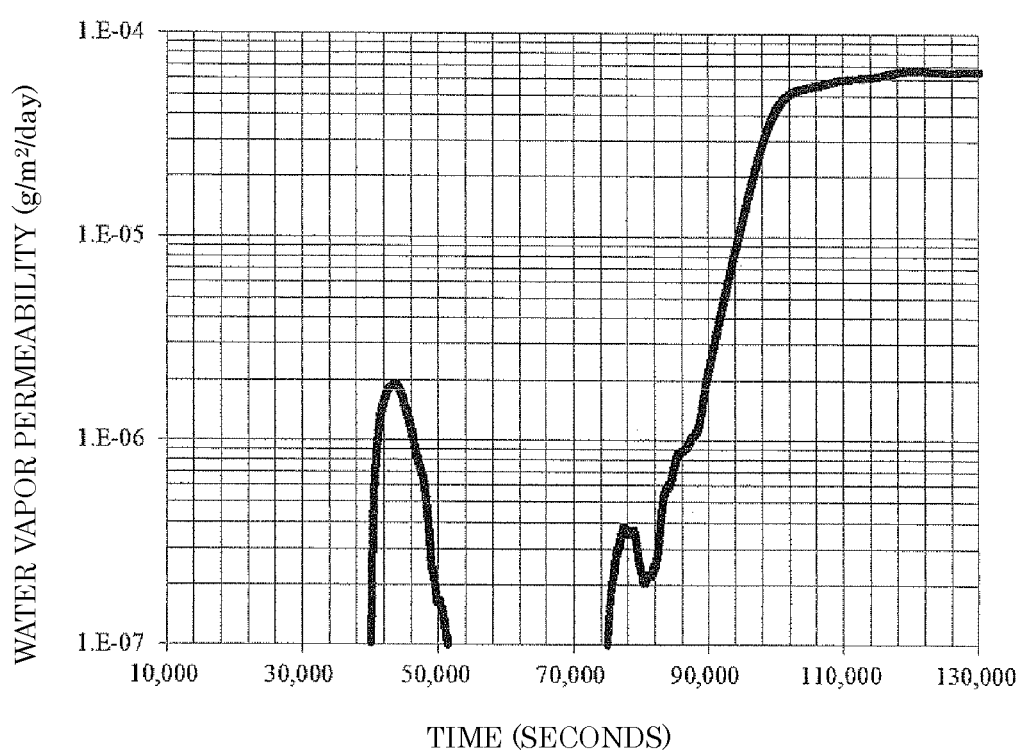
FIG. 16 is a view showing a water vapor permeability of an ALD film Sa of a sample S3 in the embodiment.

In the ALD film of the sample S3, as water vapor permeability of a region on a side of a PEN film central part (corresponding to the region a2 of FIG. 13; φ: 60 mm) was measured based on ISO 15105-1, a result as shown in FIG. 16 was obtained. As the measuring apparatus, a model Omegatrans of TI Co. was applied, and the measurement was conducted at a measurement temperature of 40° C. and a relative humidity of 90%. According to FIG. 16, in the ALD film of the sample S3, it can be read that a film characteristic having a high barrier property with a water vapor permeability of $6.5 \times 10^5$ g/m²/day has been obtained.

According to the above-mentioned ALD method and ALD apparatus of the present embodiments, the film formation by ALD can be made at lower temperatures. That is, a low temperature processing of 100° C. or lower becomes possible by using OH* in the oxidization of the ALD's source gas. As a result, it is possible to form oxide films on the processing substrate 2 under conditions of room temperature (25° C.), not heating the processing substrate 2, and cooling the processing substrate 2, etc.

OH radical has a far faster reaction rate relative to organic compounds than O radical. For example, its reaction relative to a source gas (e.g., TMA) with a single bond of carbon is about 100 times faster. With this, as compared with using plasma oxygen, lowering of the temperature progresses further, and a low temperature processing of 100° C. or lower becomes possible.

Furthermore, according to the ALD method and ALD apparatus of the present invention, a high-speed film formation by ALD is made possible. In the purging step in the ALD process, it is possible to shorten the purging time by a factor of several by using the unsaturated hydrocarbon gas or high-concentration ozone gas to be supplied to the vacuum container 3 in the film formation process, as compared with purging of the vacuum container 3 by evacuation. In each of the source gas supplying step and the oxidizing agent supplying step, it is not necessary to fill the entire vacuum container 3 with each gas. Therefore, it becomes possible to shorten the time in these steps, too. ALD requires two purging steps per one atomic layer's film formation, and the time for these steps occupies one half or more of the processing time. Therefore, it is possible to greatly shorten the film formation time of the ALD film formation step by shortening the purging steps. For example, the processing time per one molecular layer of the ALD method according to the third embodiment of the present invention was 30 seconds. In contrast with this, the processing time per one molecular layer of the ALD method according to the first and second embodiments of the present invention was 10 seconds, thereby shortening from 30 seconds to 10 seconds. Therefore, it is possible by the ALD method according to the first and second embodiments of the present invention to shorten the processing time when conducting a 100 molecular layer film formation from 50 minutes to 17 minutes, as compared with the ALD method according to the third embodiment.

Furthermore, in-plane uniformity of the oxide film formed on the processing substrate 2 is improved by uniformly blowing gas against the processing substrate 2 with the shower head 4. Furthermore, bonding sites on which the source gas is adsorbed are uniformly formed on the processing surface of the processing substrate 2. Therefore, the film thickness of the oxide film becomes more uniform. In a conventional method to fill the entire chamber with the ALD's source gas and oxidizing agent gas, distribution of the film thickness and the film property tends to occur between upstream and downstream of each gas, unless uniformly filling the entire chamber with the ALD's source gas or oxidizing agent.

Furthermore, in the ALD apparatus according to the embodiments of the present invention, the film formation occurs only directly below the shower head 4. This is because lifetime of OH radicals as the oxidizing agent generated by ejecting the high-concentration ozone gas and the unsaturated hydrocarbon from the shower head 4 and uniformly blowing them against the surface of the processing substrate 2 is extremely short, it is deactivated and does not become the oxidizing agent in sections other than directly below the shower head 4. Therefore, the film formation does not occur in waste sites such as the processing chamber wall like conventional ALD methods. This can reduce the maintenance cost.

Furthermore, it suffices to use the source gas or the high-concentration ozone gas and the unsaturated hydrocarbon gas to be supplied from the shower head 4, in an amount that is blown against the wafer's surface. It is not necessary to fill the entire vacuum container 3 like conventional ALD methods. Therefore, it is possible to form the oxide film with a small amount of gas.

Furthermore, the ALD method according to the embodiments of the present invention uses a plasma-less oxidizing agent. Therefore, the processing substrate 2 and the film formed on the processing substrate 2 are free from plasma damage.

As above, the ALD method and the ALD apparatus of the present invention were explained by showing specific embodiments. The ALD method and the ALD apparatus of the present invention are, however, not limited to the embodiments. It is possible to conduct suitable design changes to the extent of not damaging their characteristics, and those obtained by the design changes also belong to the technical scope of the present invention.

The invention claimed is:

1. An atomic layer deposition method for forming an oxide film on a processing substrate, comprising:
a source gas supplying step of supplying to the processing substrate a source gas that contains an element constituting the oxide film, thereby forming an adsorbed layer of the source gas on a surface of the processing substrate;
a source gas purging step of purging an excess gas of the source gas supplied in the source gas supplying step and a gas generated by an adsorption of the source gas onto the processing substrate, after the source gas supplying step;
an oxidizing agent supplying step of supplying an ozone gas of 20 volume % or greater and an unsaturated hydrocarbon gas to the processing substrate formed thereon with the adsorbed layer of the source gas, after the source gas purging step, thereby oxidizing the adsorbed layer adsorbed onto the processing substrate; and
an oxidizing agent purging step of purging an excess gas of the ozone gas and the unsaturated hydrocarbon gas, which are supplied in the oxidizing agent supplying step, and a gas generated by oxidizing the adsorbed layer of the source gas, after the oxidizing agent supplying step;
wherein one or both steps of the source gas purging step and the oxidizing agent purging step are conducted by introducing the unsaturated hydrocarbon gas into a vacuum container equipped with the processing substrate,
wherein at least one cycle of the source gas supplying step, the source gas purging step, the oxidizing agent supplying step, and the oxidizing agent purging step is repeated,
wherein one or both of supplying the source gas and supplying the unsaturated hydrocarbon gas are conducted together with supplying a carrier gas,
wherein, in supplying the carrier gas, there are conducted a first step of supplying the carrier gas at a predetermined flow rate, and a second step of resuming supplying the carrier gas at a flow rate that is higher than that of the first step, after supplying the carrier gas by the first step is stopped.

2. The atomic layer deposition method as claimed in claim 1, wherein the source gas, the ozone gas or the unsaturated hydrocarbon gas is supplied separately or in combination from a shower head provided to be opposed to the processing substrate.

3. The atomic layer deposition method as claimed in claim 1, wherein the unsaturated hydrocarbon gas is ethylene gas.

4. The atomic layer deposition method as claimed in claim 1, wherein the processing substrate is heated at 100° C. or lower or not heated.

5. The atomic layer deposition method as claimed in claim 1, wherein the oxide film comprises an oxide film layer of any of $Al_2O_3$, $HfO_2$, $TiO_2$, $ZnO$, $Ta_2O_3$, $Ga_2O_3$, $MoO_3$, $RuO_2$, $SiO_2$, $ZrO_2$, and $Y_2O_3$.

6. The atomic layer deposition method as claimed in claim 1, wherein four steps of the source gas supplying step, the source gas purging step, the oxidizing agent supplying step, and the oxidizing agent purging step are conducted by a plurality of cycles,
wherein, in the source gas supplying step of the steps conducted by the plurality of cycles, a different type of the source gas is supplied to the processing substrate.

7. The atomic layer deposition method as claimed in claim 1, wherein, before or after conducting four steps of the source gas supplying step, the source gas purging step, the oxidizing agent supplying step and the oxidizing agent purging step, an oxide film is formed on the processing substrate by simultaneously supplying the source gas, the ozone gas, and the unsaturated hydrocarbon gas.

8. The atomic layer deposition method as claimed in claim 1, wherein, in one or both of the source gas purging step and the oxidizing agent purging step, a purging gas supplied to the vacuum container has an atmospheric dew point of −50° C. or lower.

9. The atomic layer deposition method as claimed in claim 1, wherein pressure of the vacuum container is 1000 Pa or lower.

10. An atomic layer deposition method for forming an oxide film on a processing substrate, comprising:
a source gas supplying step of supplying to the processing substrate a source gas that contains an element constituting the oxide film, thereby forming an adsorbed layer of the source gas on a surface of the processing substrate;
a source gas purging step of purging an excess gas of the source gas supplied in the source gas supplying step and a gas generated by an adsorption of the source gas onto the processing substrate, after the source gas supplying step;
an oxidizing agent supplying step of supplying an ozone gas of 20 volume % or greater and an unsaturated hydrocarbon gas to the processing substrate formed thereon with the adsorbed layer of the source gas, after the source gas purging step, thereby oxidizing the adsorbed layer adsorbed onto the processing substrate; and
an oxidizing agent purging step of purging an excess gas of the ozone gas and the unsaturated hydrocarbon gas, which are supplied in the oxidizing agent supplying step, and a gas generated by oxidizing the adsorbed layer of the source gas, after the oxidizing agent supplying step;
wherein one or both steps of the source gas purging step and the oxidizing agent purging step are conducted by introducing the ozone gas into a vacuum container equipped with the processing substrate,
wherein at least one cycle of the source gas supplying step, the source gas purging step, the oxidizing agent supplying step, and the oxidizing agent purging step is repeated.

11. The atomic layer deposition method as claimed in claim 10, wherein one or both of supplying the source gas and supplying the unsaturated hydrocarbon gas are conducted together with supplying a carrier gas.

12. The atomic layer deposition method as claimed in claim 11, wherein, in supplying the carrier gas, there are conducted a first step of supplying the carrier gas at a predetermined flow rate, and a second step of resuming supplying the carrier gas at a flow rate that is higher than that of the first step, after supplying the carrier gas by the first step is stopped.

13. An atomic layer deposition method for forming an oxide film on a processing substrate, comprising:
a source gas supplying step of supplying to the processing substrate a source gas that contains an element constituting the oxide film, thereby forming an adsorbed layer of the source gas on a surface of the processing substrate;
a source gas purging step of purging an excess gas of the source gas supplied in the source gas supplying step and a gas generated by an adsorption of the source gas onto the processing substrate, after the source gas supplying step;
an oxidizing agent supplying step of supplying an ozone gas of 20 volume % or greater and an unsaturated hydrocarbon gas to the processing substrate formed thereon with the adsorbed layer of the source gas, after the source gas purging step, thereby oxidizing the adsorbed layer adsorbed onto the processing substrate; and
an oxidizing agent purging step of purging an excess gas of the ozone gas and the unsaturated hydrocarbon gas, which are supplied in the oxidizing agent supplying step, and a gas generated by oxidizing the adsorbed layer of the source gas, after the oxidizing agent supplying step;
wherein one or both steps of the source gas purging step and the oxidizing agent purging step are conducted by introducing an inert gas into a vacuum container equipped with the processing substrate,
wherein at least one cycle of the source gas supplying step, the source gas purging step, the oxidizing agent supplying step, and the oxidizing agent purging step is repeated,
wherein one or both of supplying the source gas and supplying the unsaturated hydrocarbon gas are conducted together with supplying a carrier gas,
wherein, in supplying the carrier gas, there are conducted a first step of supplying the carrier gas at a predetermined flow rate, and a second step of resuming supplying the carrier gas at a flow rate that is higher than that of the first step, after supplying the carrier gas by the first step is stopped.

* * * * *